United States Patent Office 3,644,532

Patented Feb. 22, 1972

3,644,532

POLYCYCLIC DIMERCAPTANS

Donald R. Arnold, Lincolndale, N.Y., David J. Trecker, South Charleston, W. Va., and Charles E. Stehr, Stamford, Conn., assignors to Union Carbide Corporation, New York, N.Y.

No Drawing. Continuation-in-part of application Ser. No. 365,527, May 6, 1964, now Patent No. 3,483,102. This application Oct. 2, 1968, Ser. No. 764,657

Int. Cl. C07c *149/26*

U.S. Cl. 260—609 D 5 Claims

ABSTRACT OF THE DISCLOSURE

Dimercaptans of cycloadded dimers of a mercaptonorbornene, mercapto-cyclohexene or mercaptobicyclo [2.2.2] octene are disclosed. They are useful in the production of polymers and as epoxy curing agents.

This application is a continuation-in-part of U.S. patent application Ser. No. 365,527, filed May 6, 1964, now U.S. 3,483,102, issued Dec. 9, 1969.

This invention relates to a novel process for producing multi-ring alicyclic compounds, particularly compounds containing from 3 to 5 cycloaliphatic rings and possessing within a bridging cyclobutane ring joining at least some of the rings in the compound. In addition, this invention encompasses novel compounds obtainable from the above process.

The process of this invention involves the cyclo-addition of a cyclic ethylenically unsaturated organic compound, i.e.,

I

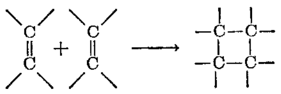

This equation represents what is characterized as a cycloaddition reaction, i.e., the addition between two ethylenically unsaturated radicals to form a cyclobutane ring moiety. The compounds which may be reacted to achieve cycloaddition are cyclic ethenically unsaturated organic compounds possessing ethylenic unsaturation which is free of double bond conjugation. Such compounds may possess double bonded carbon atoms which are conjugated with other double bonds so long as the compound possesses at least one non-conjugated ethylenically unsaturated group.

The process of this invention achieves cycloaddition of such compounds by a photosensitized reaction, i.e., by energetically inducing the cycloaddition reaction in the presence of a photosensitizer. Illustrative cyclic ethylenically unsaturated organic compounds which may be cycloadded by the process described herein include, for example, cyclobutene, cyclopentene, cyclohexene, 2-norbornene, cyclooctene, bicyclo[2.2.2]octene, cyclononene, cyclodecene, cycloundecene, cyclododecene, the functional derivatives of these cyclic compounds, as well as the polyethylenically unsaturated cyclenes, such as the cyclododecadienes, the cycloundecadienes, and the like, i.e., which possess more than one ethylenic unsaturation at least one of which is free of double bond conjugation. Additional compounds will be shown below. By cycloaddition of the cyclic ethylenically unsaturated organic compounds, such as described above, it is possible to produce dimerized, etc., compounds which represent fused species of the cyclic ethylenically unsaturated compounds and mixtures thereof.

The use of a sensitizer in a photochemical reaction is known. However, sensitizers have not been employed in a photochemical reaction involving the cycloaddition of cyclic ethylenically unsaturated organic compounds, as defined herein. Heretofore, it had been considered that in the photosensitized reaction of an ethylenic double bond there must be provided an activation group(s) in association with said bond which provides activation of the bond and achieves the reaction. For example, it is well known to dimerize olefins possessing conjugated double bonds, regardless of whether one of the conjugated double bonds is that between two carbon atoms or between carbon and oxygen. However, it was not thought possible to dimerize a cyclic ethylenically unsaturated organic compound through ethylenic unsaturation which is free of double bond conjugation. It has now been found that such a reaction can occur when the reaction is operated as described herein.

The process of this invention involves providing the cyclic ethylenically unsaturated organic compounds in admixture with a photosensitizer, and subjecting this intermixture to sufficient energy to cause cycloaddition. More particularly, the amount of energy provided to the intermixture should be sufficient to place the sensitizer in an activated state from which it releases energy. The release of energy for utilization in achieving the reaction herein represents the transfer of energy from the photosensitizer to the cyclic ethylenically unsaturated organic compound in sufficient amounts and kind to achieve cycloaddition. In essence, the sensitizer acts as a transferrer of energy to the cyclic ethylenically unsaturated compound which, by definition, becomes the acceptor of the energy. Throughout the following, the sensitizer will be termed "sensitizer" or "transferrer" and the cyclic ethylenically unsaturated organic compound will be termed "acceptor."

Though applicants do not wish to be held to any specific theory for the operation of the process of this invention, certain principles have been developed in the field of photosensitization which suggest a logical explanation of the reaction herein. It is believed that the reaction achieving cycloaddition is the result of providing energy to the sensitizer so that it is converted to an activated state from which it is capable of releasing energy to the acceptor. It is believed that what is involved in the activation of the sensitizer is the movement of an electron in the sensitizer from one quantum energy level to a higher quantum energy level because of adsorbtion of energy. Upon attaining this activated state the sensitizer is then capable of deactivation to its normal (ground) state. During deactivation, the sensitizer releases energy. For example, the sensitizer upon activation enters the singlet state and then is converted to the triplet state. From the triplet state, the sensitizer passes to the ground state. It is opined that effective energy is promoted when the sensitizer is converted from the triplet to the ground state. However, applicants do not wish to be held to this particular feature since it may also be possible that operative energy transfer can be effected when the sensitizer is brought to or from a different activated state.

As noted above, the sensitizer, when provided in the activated state, is capable of transferring energy. The acceptor, in the instant case the cyclic ethylenically unsaturated organic compound, can, as a result of close association with the sensitizer, accept the transfer of energy and, itself, be converted to an activated state. Hence it is believed that the acceptor develops excitation of an electron from one quantum energy level to a higher quantum energy level in much the same manner as the sensitizer. As a result, the acceptor attains an activated state from which it is capable of releasing and transferring energy in much the same manner as the sensitizer. Because of the close proximity of two acceptor molecules, at least one of which is in the activated state, the cycloaddition reaction between two acceptor molecules occurs. It is thought that the acceptor, as a result of transfer of energy from the sensitizer to the acceptor, is energized to the triplet state. As a result of cycloaddition, dissipation of energy from the acceptor occurs.

Broadly speaking, what is essentially involved in effecting cycloaddition by photochemical reaction is the utilization of energy to activate the cyclic ethylenically unsaturated organic compound. The activated compound is then readily dimerized with the same or similar molecular species. The significance of the photosensitized reaction is that it is possible through the utilization of sensitizers to supply substantial amounts of energy to the acceptor that heretofore would have been inordinately expensive to provide, difficult to achieve, and basically impractical to utilize when other energy providing means are employed.

By virtue of the close proximity that is obtainable between the activated sensitizer and the acceptor, the sensitizer is capable of readily and easily transferring energy to the acceptor and the acceptor thereafter becomes activated for the dimerization (cycloaddition) reaction.

Thus, it is desirable to provide in association with the acceptor, sufficient activated sensitizer so as to achieve the desired reaction. This means that sufficient energy should be provide to the system to achieve activation of the sensitizer and to supply the needed energy to achieve the desired reaction. This means that environmental temperature coupled with energy provided from such sources as, e.g., light, gamma radiation, etc., in association with the activation level of the sensitizer will often determine the success of the desired reaction.

As a result of absorption of energy by the sensitizer, the sensitizer, in the typical case, will be converted to an activated state from which it emits illumination. This may be indicated by fluorescene and/or phosphorescene. Of the two, phosphorescence is thought to be indicative of that state which provides the energy transfer for the reaction herein defined. As indicated above, that state is believed to be the triplet state. It is as a result of luminescence, particularly in the case of phosphorescence, that one can measure the amount of energy which is transferable from the sensitizer to the acceptor. Techniques for measuring the amount of energy released, typically in terms of kilocalories, are well known.

By virtue of operating the reaction under ambient conditions of temperature and pressure one is able to acertain the operative amount of energy released by the sensitizer to effect the reaction. This tends to indicate the amount of energy which one must provide in the system by virtue of factors such as temperature, energy from sources of radiation, and the like, other than from the selected sensitizer, to achieve activation of the sensitizer.

Broadly speaking, two types of energy can be provided to the mixture or to the sensitizer to effect activation of the acceptor, to wit, vibrational energy and electronic energy. Of particular significance is electronic energy which can be introduced by electromagnetic radiation, e.g., gamma rays, X-rays, vacuum ultraviolet, ultraviolet, visible light, and the like. Useful electronic radiation may range from about 0.005 A. (angstroms) to about 7000 A. The intensity of radiation does not appear to be a critical feature to effect operativeness, but however, intensity is believed to be important as a rate determining factor.

Vibrational radiation, i.e., thermal energy, is not nearly as important as electronic radiation in effecting the reaction. However, it can play a part in achieving activation of the acceptor. The temperature of the instant reaction can range broadly from about −50° C., and lower, up to about 500° C., and higher. However, it is important that the reaction be carried out below the decomposition temperature of the acceptor(s), the sensitizer(s) and the reaction product(s) and be at a temperature at which the rates of reaction are the most economical for the reaction under consideration. It is particularly preferred that the temperature of reaction be in the range of about 0° C. and 350° C., most preferably between 15° C. and 100° C. Optimumly, the reaction is affected in a homogeneous liquid phase medium. It is under these conditions that the most intimate molecular association between the sensitizer and the acceptor is achieved for proper energy transfer for product formation.

Though electromagnetic radiation directly to the acceptor can contribute to its activation, the most significant energy transfer to the acceptor is that transferred from the sensitizer. Hence, it is desirable that the selected sensitizer be one which is capable of absorbing enough energy from outside sources so that it, substantially alone, can transfer energy to the acceptor in amount sufficient to activate the acceptor for the reaction. Therefore, it is particularly desirable in the practice of the process of this invention to utilize electromagnetic radiation of wavelengths sufficient to particularly activate the sensitizer rather than the acceptor, and preferably, to exclusively activate the sensitizer rather than the acceptor. The activated sensitizer will in turn, activate the acceptor. It is highly desirable and practical in the practice of this invention, though not necessarily critical to the invention, to utilize a sensitizer which when in the active state, particularly in the triplet state, is capable of releasing an amount of energy typically in excess of that which the acceptor from its activated state is capable of releasing. Thus, preferably, the triplet energy level of the sensitizer, determined in terms of kilocalories released on going to ground state, should be higher than that of the triplet energy level of the acceptor. This condition typically exists when during the determination of phosphorescence of a mixture of the two, phosphorescence from the sensitizer is quenched. However, when phosphorescence occurs, then the triplet energy state of the acceptor is too high and the energy transfer fails to occur. In essence, it is meant that it is preferable that the activation of the acceptor be an exothermic reaction rather than an endothermic reaction. This provides for ease of operation, higher yields and greater rates of reaction.

Many compounds are known to be sensitizers and many are usable in the practice of the present invention. It is also recognized by those skilled in the art that the number and kind of sensitizers known represents only a small fraction of those materials which will be usable as sensitizers at some future date. Thus the specific materials described herein which may be utilized as sensitizers in the practice of this invention are not to be considered as representing the complete class of sensitizers which are employable.

In preferable operation, the sensitizers should be relatively stable in the process environment, i.e., the rate of decomposition of the sensitizer should be at least less than the rate of reaction in formation of the desired reaction product. In the most preferred operation, the sensitizer which is employed should be relatively insignificantly decomposed during operation of the instant process. By insignificant decomposition, it is meant that no more than 10 mole percent of the sensitizer is decomposed during the transformation of 1 mole of the cyclic ethylenically unsaturated organic compound into product. The sensitizer may be inorganic or organic. Particularly preferred are the organic sensitizers in view of their ability to form a homogeneous liquid phase mixture with the cyclic ethylenically unsaturated organic compounds which are to be cycloadded.

Illustrative of usable sensitizers include, for example, mercury, acetophenone, p-chloroacetophenone, m-chloro-acetophenone, p-methylacetophenone, m-methylacetophenone, p-methoxyacetophenone, m-methoxyacetophenone, phenyl cyclopropyl ketone, dicyclopropyl ketone, acetone, diisopropyl ketone, isopropyl methyl ketone, methyl ethyl ketone, p-dichlorobenzene, pyrazine, m-dichlorobenzene, benzene, m-difluorobenzene, p-difluorobenzene, o-difluorobenzene, toluene, p-xylene, m-xylene, o-xylene, benzoic acid, benzonitrile, pyridine, trifluorotoluene, and the like.

As indicated previously, the organic sensitizers are particularly preferred because of their ability to form homogeneous liquid phase mixtures with the organic compound, i.e., form a solution. It has been found that the sensitizer and/or acceptor can act as the solvent in the formation of solutions. The reaction can be carried out in the presence of an ingredient solely added as a solvent. It is desirable that such a solvent be inert to the reaction, that is, it does not adversely affect formation of the desired product or cause undue dissipation of sensitizer so as to provide economic losses. Typically useful solvents are the alkanes, benzene, fluorinated hydrocarbons, alkyl ethers, alkylene ethers, water, and the like. Particularly illustrative of these are, for example, hexane, nonane, heptane, octane, dodecane, 2-ethylhexane, cyclohexane, cyclooctane, cyclododecane, benzene, perfluoropropane, perfluorobutane, perfluoroethane, perfluoromethane, trifluoroethane, tetrafluoropropane, tridecafluorohexane, perfluorooctane, tetrahydrofuran, dioxane, dimethylether, diethylether, di-n-propylether, diisopropylether, di-n-butylether, di-n-hexylether, di-n-dodecylether, the dialkyl ethers of glycols, such as dimethylether of ethylene glycol, dimethylether of diethylene glycol, diethylether of ethylene glycol, diethylether of di-1,2-propylene glycol, and the like.

As pointed out previously the source of energy which effects activation of the sensitizer is desirably one which emits an electronic radiation in wavelengths ranging from about 0.005 A. to about 7000 A. (angstroms). It is particularly desirable to utilize electronic radiation in the wavelengths of from about 0.005 A. to about 4500 A., most preferably from about 0.005 A. to about 4000 A. In practical operation of the process of this invention in which decomposition of the sensitizer is appreciably avoided, it is desirable to operate at radiation wavelengths of from about 2400 A. to about 4000 A. The electronic radiation which is sufficient to effect excitation, energizing or activation of the sensitizer can be achieved with, for example, a gamma radiation source such as cobalt 60, a Van de Graaff generator, or the like; an X-ray source such as a vacuum tube or the like; a vacuum ultraviolet light source such as a xenon lamp, a mercury arc, or the like; a near ultraviolet light source such as an Argon arc, a mercury arc, a xenon lamp, or the like; a visible light source such as sunlight, a sunlamp, a tungsten bulb, a carbon arc, a laser, an argon plasma arc, an oxygen induction coil, or the like.

The nature of the reaction is simply characterized as cycloaddition, as illustrated in Equation II, with respect to the dimerization of cyclohexene; as illustrated in Equation III, with respect to the dimerization of 2-norbornene; and as illustrated in Equation IV, with respect to the dimerization of bicyclo(2.2.2) octene:

II
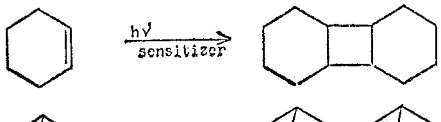

III
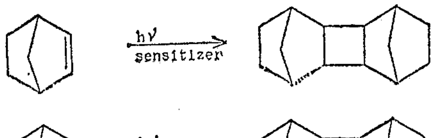

IV
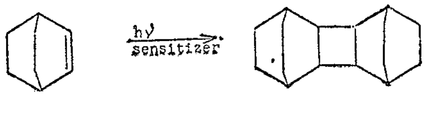

In addition to straightforward dimerization involving like molecules, dimerization may also be achieved utilizing unlike molecules whereby to form an alicyclic compound wherein the ring structures on the ends thereof vary. Illustrative of this is the cycloaddition between cyclohexene and norbornene as characterized in Equation V.

V
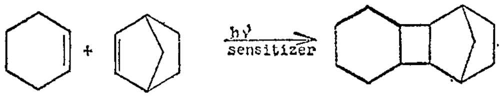

It is also to be appreciated that substituted cyclic ethylenically unsaturated organic compounds, such as characterized in Equation VI, wherein Formulas a and b, X, Y, A, B, U, Z, *p, q, n, m, t, s* are as defined below, may under the conditions of this reaction produce a dimerized compound such as characterized by Formula VII below.

VI
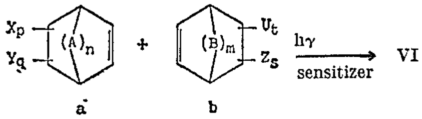

The alicyclic compounds obtainable directly or indirectly from the process of this invention may be characterized by the formula:

VII
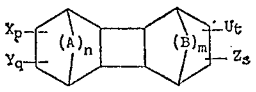

wherein X and U, each taken alone, may be hydrogen, alkyl (particularly of from 1 to about 18 carbon atoms, preferably of from 1 to about 8 carbon atoms; the total number of carbon atoms from all the alkyl groups should not exceed 48), halogen (i.e., chlorine, bromine, fluorine, and iodine), and mixtures thereof; Y and Z are monovalent radicals different from X and U and divalent radicals when combined with X and U, respectively; *p* and *t* may be integers of from 0 to 10, preferably from 1 to 10, *q* and *s* may be an integer of from 0 to 6, preferably from 1 to 6; the sum of *p* and *q* and the sum of *t* and *s* is 10, *n* and *m* may be one of the integers 0 and 1; A and B may be one of the structures $=C(T)_2$ and $-C(T)_2-C(T)_2-$, wherein T is any one of the radicals selected from those defining X and Y; and X and Y, together, and U and Z together, may be joined to form an alkylene bridge of from about 2 to 8 carbon atoms or an alkenylene bridge of from about 2 to 8 carbon atoms or an oxirane oxygen atom or carboxyanhydride or oxycarbonyloxy; all remaining free valences are satisfied by hydrogen. Preferably, the alicyclic compound possesses only hydrogen and carbon directly bonded to the carbon atoms of the cyclobutane moiety therein.

Illustrative of Y and Z are, e.g., aryl (e.g. phenyl, naphthyl, etc.), alkenyl (e.g., from 2 to about 18 carbon atoms, preferably from 2 to about 8 carbon atoms), alkynyl (e.g., from 2 to about 18 carbon atoms, preferably from 2 to about 8 carbon atoms), cycloalkyl (e.g., from about 4 to 8 carbon atoms, preferably from about 5 to 7 carbon atoms), cycloalkenyl (e.g., from about 4 to 8 carbon atoms, preferably from about 5 to 7 carbon atoms), alkaryl (where the alkyl moiety thereof is as defined above for "alkyl" and the aryl moiety is as defined above for "aryl"), aralkyl (wherein the aryl moiety thereof is defined above for "aryl" and the alkyl moiety is as defined above for "alkyl"), cycloalkynyl (e.g., having from about 6 to 10 carbon atoms, preferably from about 8 to 10 carbon atoms), and functional radicals as $$R-\overset{\overset{O}{\|}}{C}-\overset{\overset{H}{|}}{N}-$$

(alkamido, wherein R as alkyl of from 1 to about 19 carbon atoms), $$R-\overset{\overset{O}{\|}}{C}-O-$$

(alkanoyloxy), $$R_1\overset{\overset{O}{\|}}{C}-O-$$

(aryloxy, wherein $R_1$ is an aromatic ring), $$H\overset{\overset{O}{\|}}{C}-\underset{H}{N}-$$

(formamido), $$R-\overset{\overset{O}{\|}}{C}-$$

(alkanoyl), $$NH_2CH_2\overset{\overset{O}{\|}}{C}-$$

(glycyl), $$HO\overset{\overset{O}{\|}}{C}-NH-$$

(carbamyl), $$HOCH_2\overset{\overset{O}{\|}}{C}-$$

(glycolyl), $$H\overset{\overset{O}{\|}}{C}-$$

(formyl), haloformyl (e.g., $$Cl\overset{\overset{O}{\|}}{C}-,\ Br\overset{\overset{O}{\|}}{C}-,\ I\overset{\overset{O}{\|}}{C}-)$$

or formyloxy, $$HS\overset{\overset{O}{\|}}{C}-\overset{\overset{H}{|}}{N}-$$

(thiocarbamyl), $$-\overset{\overset{O}{\|}}{C}-OR$$

(carboalkoxy; R is as defined above), $$-\overset{\overset{O}{\|}}{C}-OH$$

(carboxy), $$-\overset{\overset{O}{\|}}{C}-NR'R''$$

(carboxamide; wherein R' and R'' are each as defined above for R and $R_1$ or each may be hydrogen), hydroxyalkyl of from 1 to about 8 carbon atoms, hydroxy cycloalkyl of from about 4 to 8 carbon atoms, hydroxypolyalkylene oxide e.g., HO $(R'''O)_cR'''$ (wherein R''' is alkylene or aryl and alkyl substituted alkylene of from 2 to 8 carbon atoms and c is a whole number of at least one and typically not greater than 1000, and the like), —C≡N (cyano), RO— (alkoxy; R is as defined above), $R_1O$— (aryloxyl; $R_1$ is defined above), HSR''' (thioalkyl; R''' is as defined above), $HSR_2$— (thioaryl; wherein $R_2$ is arylene), $H_2N$— (amino), —NR''R': (alkamino; R' and R'' are as defined above), $$H_2N-\underset{H}{N}-$$

(hydrazino), $NO_2$— (nitro), NO— (nitroso), HO— (hydroxyl), HS— (mercapto) $HSO_3$— (sulfo), $HSO_3NH$— (sulfoamido), $RSO_2$— (alkylsulfonyl; R is as defined previously)

$$R_3-\underset{R_3}{C}\overset{O}{\diagup\diagdown}\underset{R_3}{C}-R_n{}^5-$$

(1,2-epoxyalkyl; wherein each $R_3$ may be hydrogen, R, $R_1$, and the like; $R^5$ may be alkoxy, R''' or $R_3$, *n* is defined above), $X_a{}^\circ C_bH_c$— (haloalkyl, wherein X° is halogeno such as chloro, bromo, iodo, fluoro, *a* is an integer of from 1 to a value equal to $2b+1$, *b* is an integer of from 1 to 18, and *c* is the value $(2b+1)-a$), and other functional hydrocarbyls such as those of the formula G—$R^5$—, wherein $R^5$ is as defined previously, and G may be $NO_2$— (nitro), HO— (hydroxy), HS— (mercapto), $HSO_3$— (sulfo), $$HS\overset{\overset{S}{\|}}{C}\overset{\overset{H}{|}}{N}-$$

(dithiocarbamyl), $$HO\overset{\overset{O}{\|}}{C}-\overset{\overset{H}{|}}{N}$$

(carbamyl), $$H_2N\overset{\overset{O}{\|}}{C}\overset{\overset{H}{|}}{N}-$$

(ureyl), RO— (alkoxy, R is defined above), $NH_2$— (amino), $R_1O$ (aryloxy, $R_1$ is defined previously), —CN (cyano), $$H_2N\overset{\overset{O}{\|}}{C}-$$

(carboxamido), $$HO\overset{\overset{O}{\|}}{C}-$$

(carboxy), $$R_4-O\overset{\overset{O}{\|}}{C}-$$

(carbohydrocarbonyloxy, $R_4$ is one of R and $R_1$), $$H\overset{\overset{O}{\|}}{C}-O-$$

(formyloxy), $$X^\circ\overset{\overset{O}{\|}}{C}-O-$$

(haloformyloxy, X° is defined previously), $$X^\circ\overset{\overset{O}{\|}}{C}-$$

(halocarboxy), $$N(R_3)_4{}^+{}^-\overset{\overset{O}{\|}}{C}-$$

(quaternary ammonium-carboxylate, wherein $R_3$ is as defined previously), $$RC-\overset{\overset{O}{\|}}{O}-$$

(alkanoyloxy, R is defined previously), $$R_1\overset{\overset{O}{\|}}{C}-O-$$

(aroyloxy, $R_1$ is defined previously), $$H_2N\overset{\overset{O}{\|}}{C}-O-$$

(amidooxy) and the like.

Illustrative of the compounds which come within the purview of Formula 1 are the following:
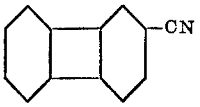
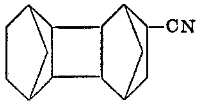
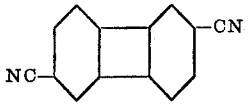
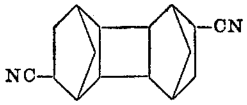
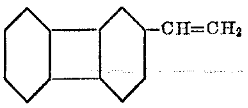
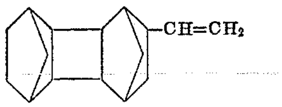
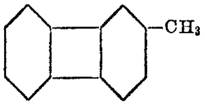
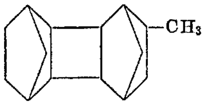
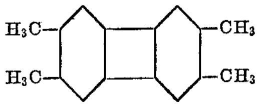
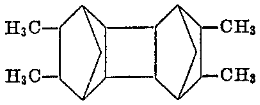
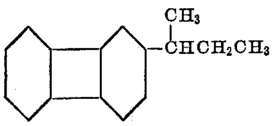
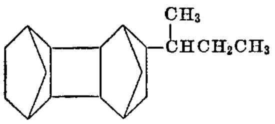
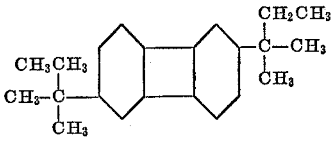
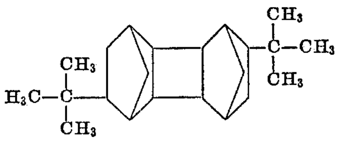
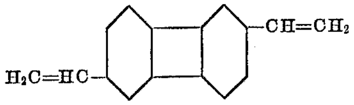
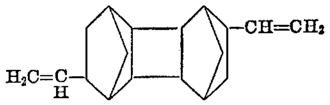
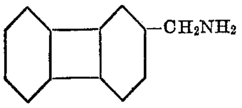
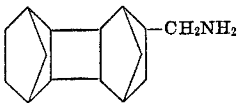
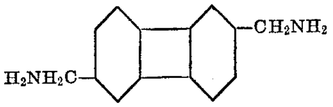
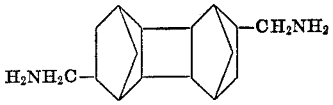
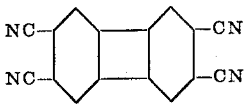
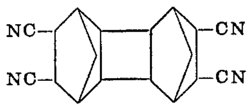
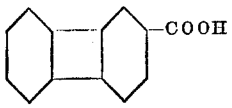
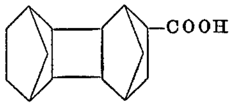
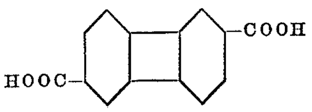
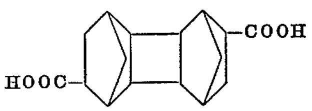
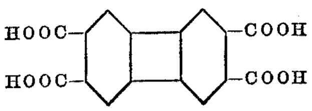
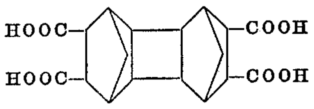

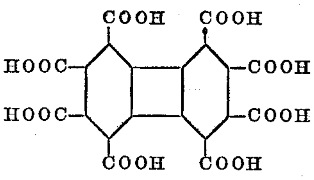
COOH COOH
HOOC COOH
HOOC COOH
COOH COOH
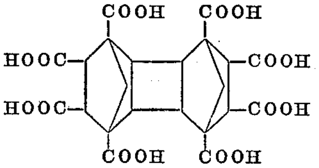
COOH COOH
HOOC COOH
HOOC COOH
COOH COOH
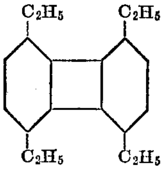
$C_2H_5$ $C_2H_5$
$C_2H_5$ $C_2H_5$
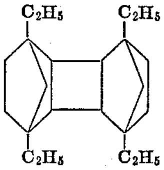
$C_2H_5$ $C_2H_5$
$C_2H_5$ $C_2H_5$
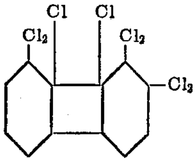
Cl Cl
$Cl_2$ $Cl_2$
$Cl_2$
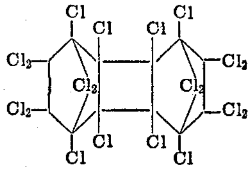
Cl Cl Cl Cl
$Cl_2$ $Cl_2$
$Cl_2$ $Cl_2$
$Cl_2$ $Cl_2$
Cl Cl Cl Cl
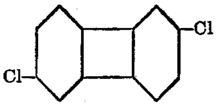
Cl
Cl
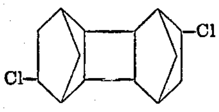
Cl
Cl
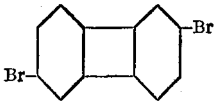
Br
Br
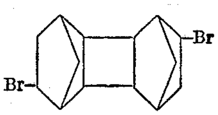
Br
Br
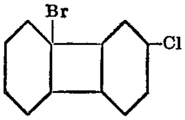
Br
Cl
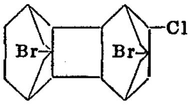
Br Br
Cl
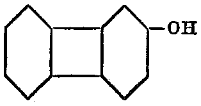
OH
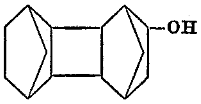
OH
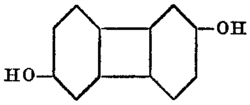
OH
HO
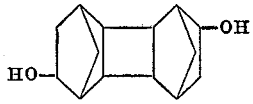
OH
HO
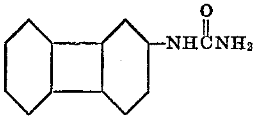
O
$NHCNH_2$
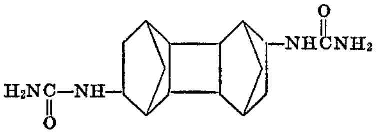
O
$NHCNH_2$
$H_2NC-NH$
O
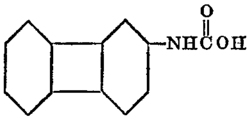
O
NHCOH
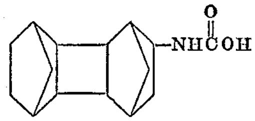
O
NHCOH
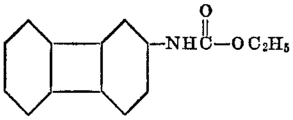
O
$NHC-OC_2H_5$
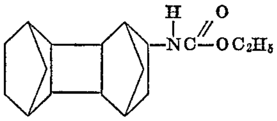
H O
$NC-OC_2H_5$
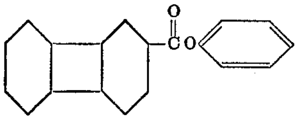
O
CO
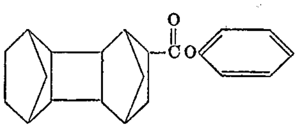
O
CO
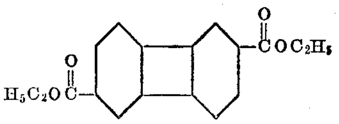
O
$COC_2H_5$
O
$H_5C_2OC$
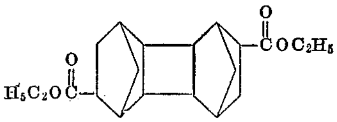
O
$COC_2H_5$
O
$H_5C_2OC$

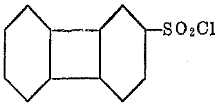
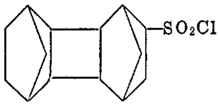
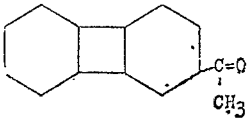
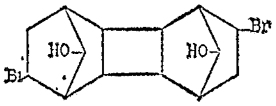
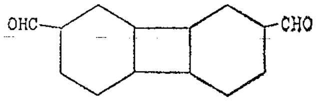
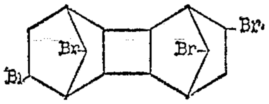
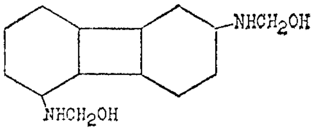
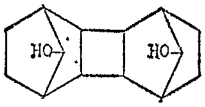
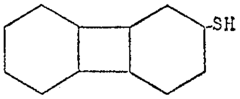
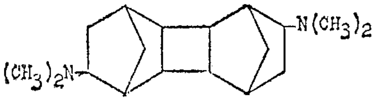
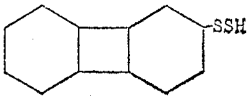
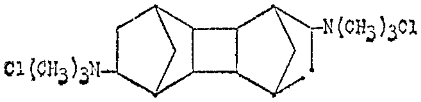
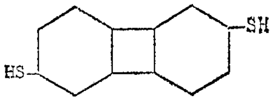
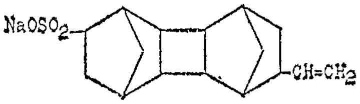
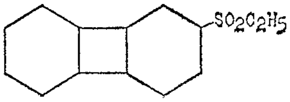
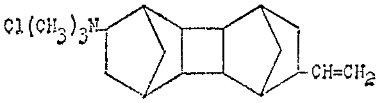
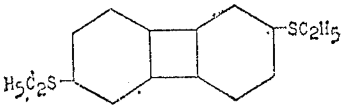
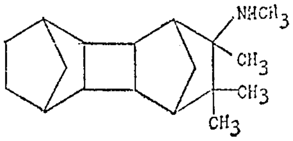
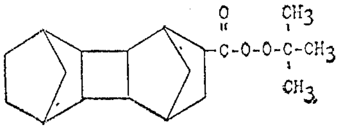
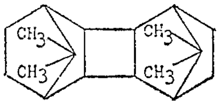
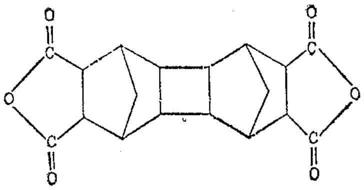
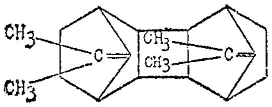
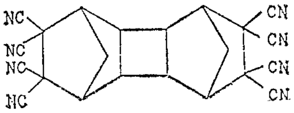
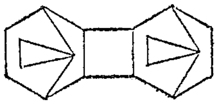

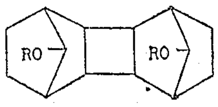
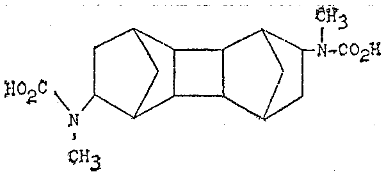
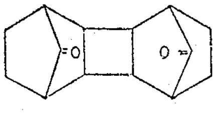
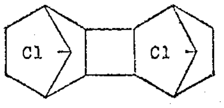
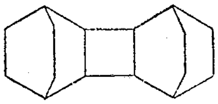
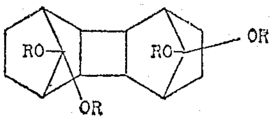
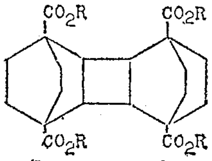
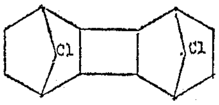
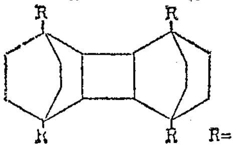
R= alkyl, aryl, alkenyl, etc.
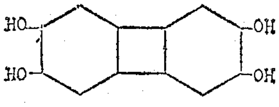
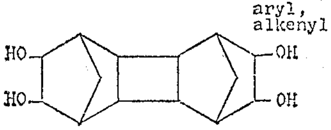
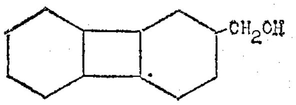
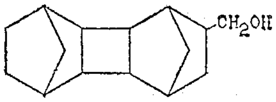
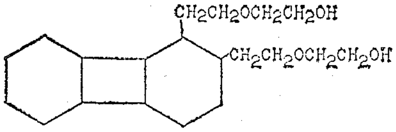
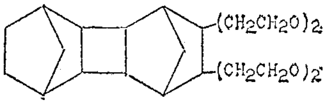
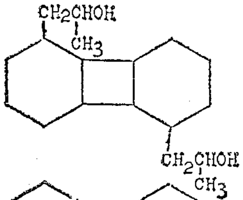
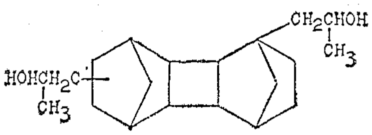
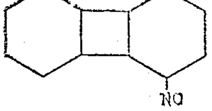
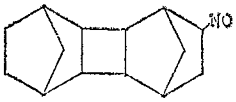
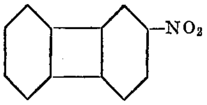
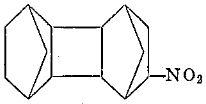
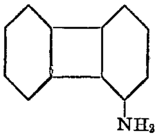
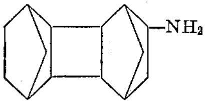
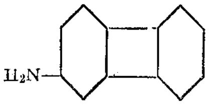
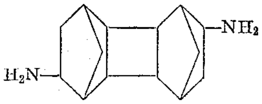

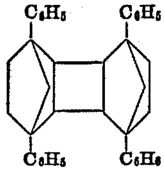
C6H5
C6H5
C6H5
C6H5
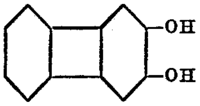
OH
OH
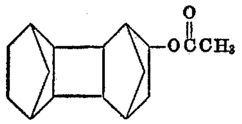
O
OCCH3
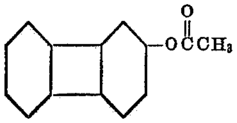
O
OCCH3
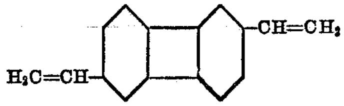
CH=CH2
H2C=CH
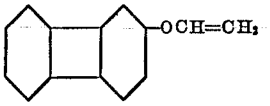
OCH=CH2
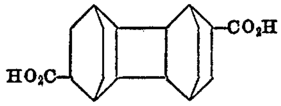
CO2H
HO2C
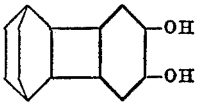
OH
OH
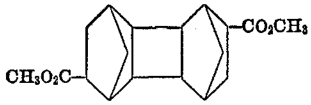
CO2CH3
CH3O2C
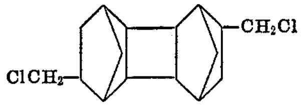
CH2Cl
ClCH2
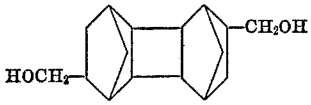
CH2OH
HOCH2
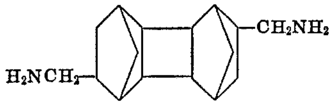
CH2NH2
H2NCH2
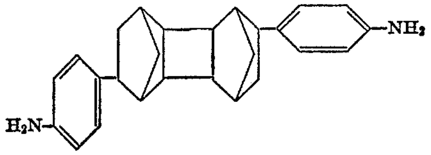
NH2
H2N
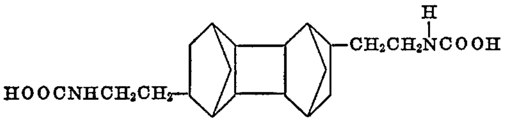
H
CH2CH2NCOOH
HOOCNHCH2CH2
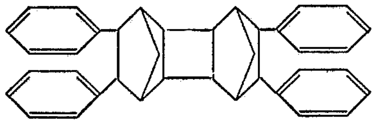
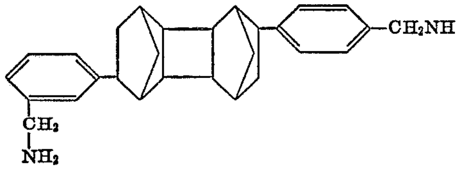
CH2NH
CH2
NH2
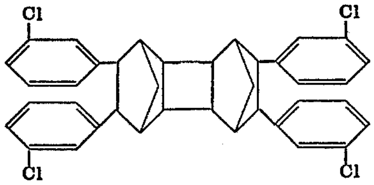
Cl
Cl
Cl
Cl
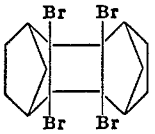
Br
Br
Br
Br
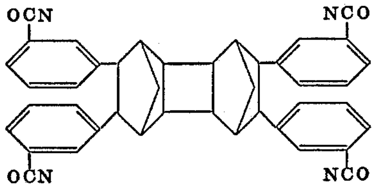
OCN
NCO
OCN
NCO
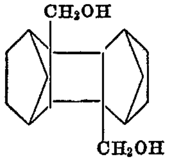
CH2OH
CH2OH
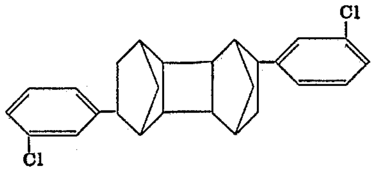
Cl
Cl
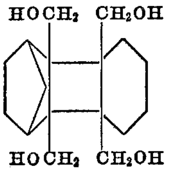
HOCH2
CH2OH
HOCH2
CH2OH

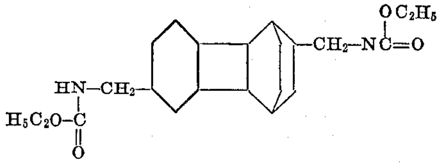
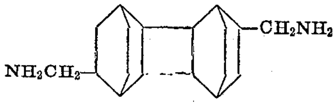
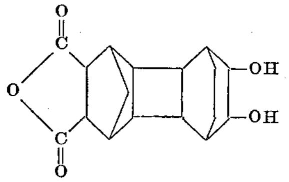
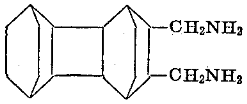
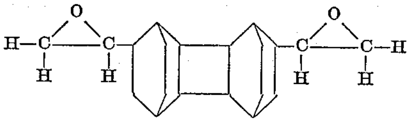
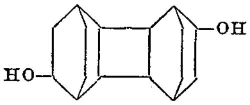
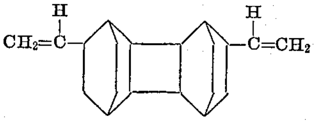
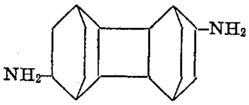
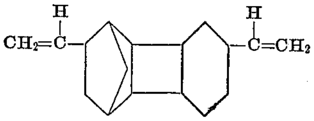
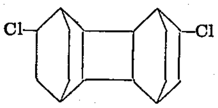
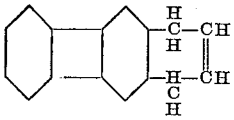
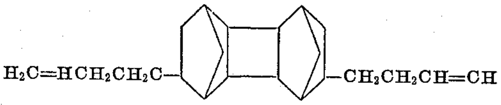
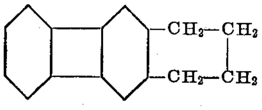
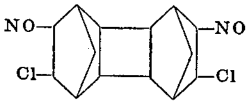
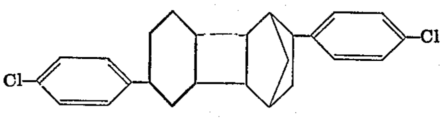
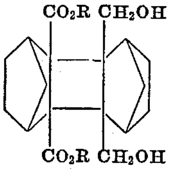
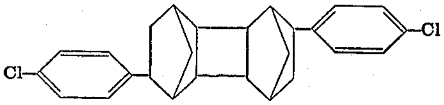
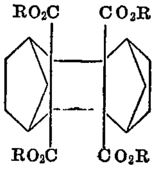
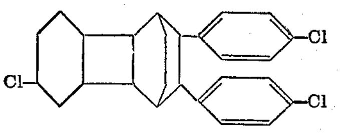
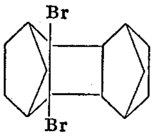
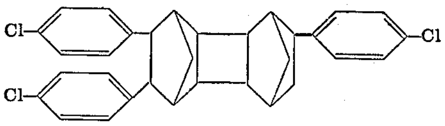
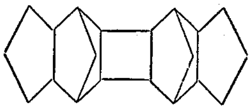
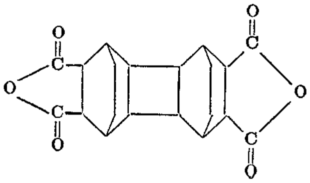
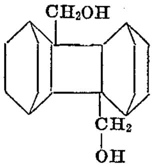

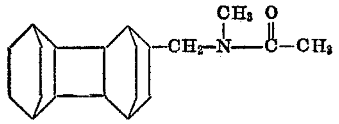
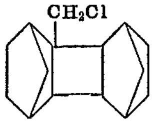
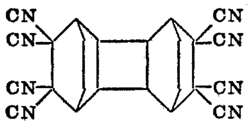
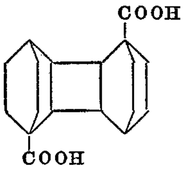
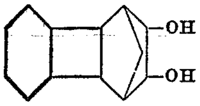
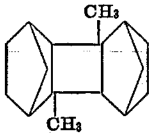
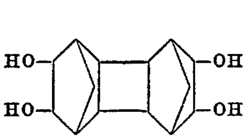
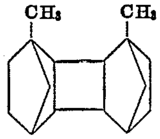
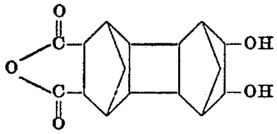
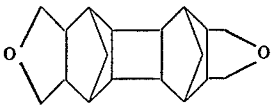
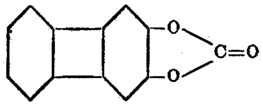
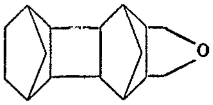
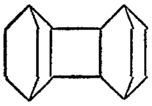
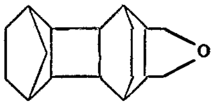
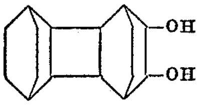
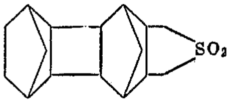
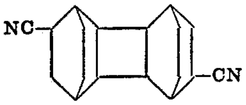
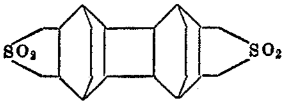
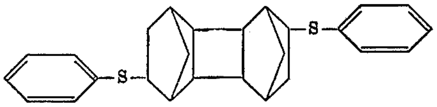
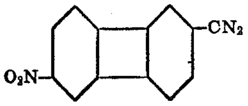
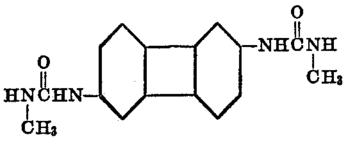

A particularly preferred class of novel alicyclic dimercapto compounds of our invention are those containing 3 to 7, preferably 5 to 7, saturated aliphatic hydrocarbon rings therein, each ring being defined as the smallest number of covalently bonded carbon atoms which form a definable ring, which rings contain 4 to 6 ring carbon atoms, at least three rings thereof are fused rings, and the two mercapto radicals thereof are each bonded to a different carbon atom, each mercapto-bonded carbon atom being in a different ring.

Illustrative of highly preferred compounds of this class are

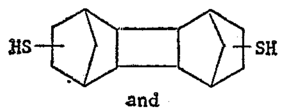

and

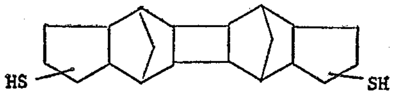

These compounds may be made by the process described hereinafter, i.e., preparation of a precursor formed by the cycloaddition process which has Cl atoms in the appropriate positions and then reacting the chlorinated intermediate with $H_2S$ to form the dimercapto derivative. Or the compounds may be prepared by the addition of a thiolcarboxylic acid, thiolacetic acid preferred, to the diolefinically unsaturated intermediate and then hydrolyzing the bis thioacetoy) derivative so formed with, e.g., a base such as sodium methoxide, in order to obtain the dimercapto derivative. Example VIII is illustrative of this latter process.

These dimercaptans are useful as novel polymer intermediates, e.g., to be reacted with sulfur dichloride, $SCl_2$, to form polytrisulfides of the type $\text{-[}SRSS\text{]-}_x$ wherein R is the cycloaliphatic moiety and $x$ is the average number of repeating units per molecule. They are also useful as epoxy resin curing agents, giving fast tack-free times.

However, some of the compounds that are embodied within Formula VII may not be obtained directly by the cyclo-addition process of this invention. Such compounds are obtained from precursors formed by the cycloaddition process. The manner in which these compounds are obtained from the precursors involves nothing more than simple, well known and established organic syntheses whereby each and every species illustrated herein and embodied by the genus of Formula I can be easily obtained. To illustrate this point, reference is made to the manufacture of a perhalo norbornene dimer by the route indicated by Equations A, as follows:

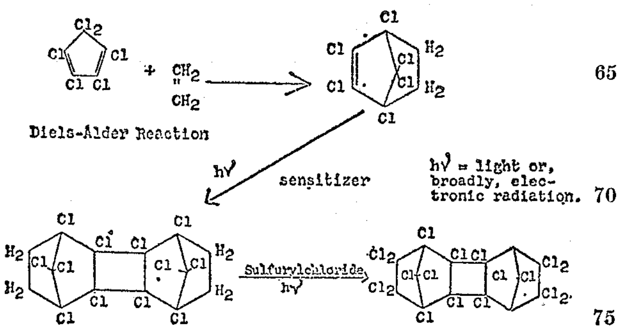

The perhalo compound, such as the perhalo norbornene dimer described above, may be converted into per-aminated products by reaction, for example, with lithium amide in the presence of liquid ammonia whereby to provide the per-aminated product. In addition the halogenated product may be converted to a percarboxy product by reaction of the halogenated product with lithium and carbon dioxide. It is readily visualized that the amine groups may be converted into urea groups, carbamic acid groups and the like by reaction with, for example, phosgene or monochloro formate, and the like. The carboxy species may be converted into ester by reaction with alcohols or phenols, or it may be converted into amide by reaction with ammonia or amines, or it may be reacted with hydrogen to be reduced to alcohols which in turn can be reacted with alkylene oxides to form polyalkylene oxide adducts. The carboxy species may be also converted into a ketone by the Grignard reaction or it may be converted to acid chloride by reaction with chlorine followed by reduction by reaction in the presence of lithium aluminum tri-t-butoxy hydride to form aldehyde. It is readily appreciated that once a functional group has been provided in the dimeric structure, practically any radical may be introduced to the structure at the site of the functional group. The site of a functional group allows changing of the group to a different group or allows introduction of any desirable radical, to achieve a desired product. For example, the perchlorinated dimer may be alkylated, even peralkylated by reaction of the perhalo species with Grignard reagents or by the Wurtz reaction whereby to provide a permethylated product, perethylated product, and the like. Of course, the same can be achieved by utilizing lesser halogenated products.

In addition, it is possible to provide a functional group at specific positions of the dimer molecule whereby to provide a site which can be converted into almost any functional radical desired. For example, the following Equation B illustrates the attachment of a functional group on the 7 position of 2-norbornene which, when dimerized provides a functional group in the dimer which can be later converted to almost any desirable group by conventional organic syntheses:

(B)

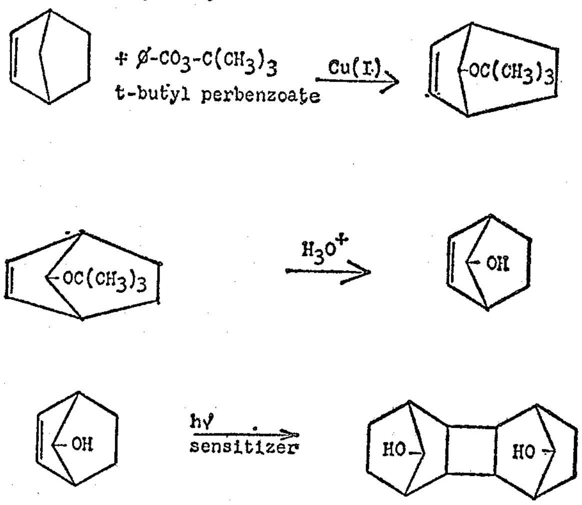

Equation C below illustrates the introduction of functional groups into the 2,3 positions of norbornene and the dimerization of the substituted norbornene to form a dimeric product possessing functional groups at the cyclobutane bridge head of the dimeric product.

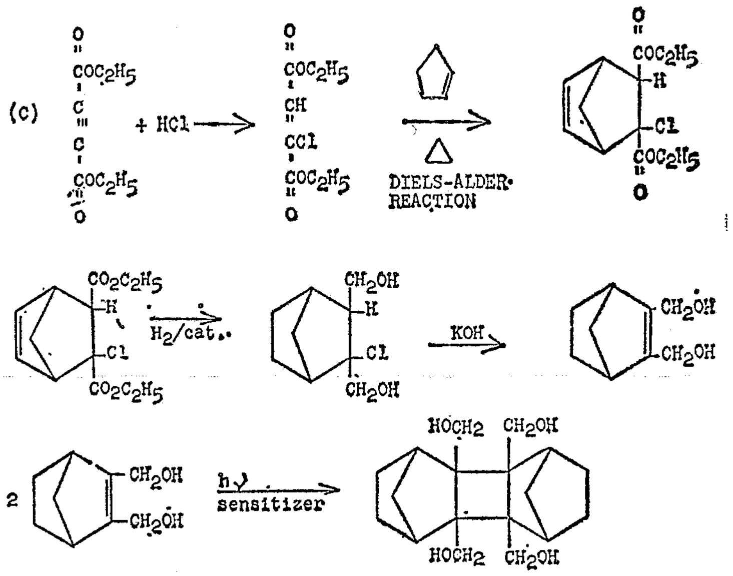

In the above equation, the hydrogenation may be effected in a hydrogen atmosphere utilizing Raney nickel catalyst, or a palladium on charcoal catalyst. It is to be appreciated that the tetramethylol groups in the dimer as characterized in Equation C can be converted by oxidation to the carboxyl group utilizing chromic acid. The resulting four carboxyl groups may be reacted with a silver base, such as silver oxide, to produce the silver salt. The resulting salt may be reacted with bromine whereby to replace the carboxyl groups with bromine and the resulting dimer product is tetrabrominated rather than tetracarboxylated.

Equation D below illustrates one procedure for introducing substituents at the 1, 4, 5 and 8 positions. It must be pointed out that aromatic rings may be also incorporated into the dimeric product by Grignard synthesis or Wurtz reaction, but however, if it is possible to incorporate the aromatic rings in the starting components, such as norbornene, such a procedure is favored. As illustrated in Equation D cyclopentadiene containing two p-chlorophenyl groups is reacted with ethylene utilizing conventional Diels-Adler reaction conditions to provide 1,4-di-p-chlorophenyl-2-norbornene. This chlorophenyl product here may be reacted under the conditions described herein to provide the desired dimeric product.

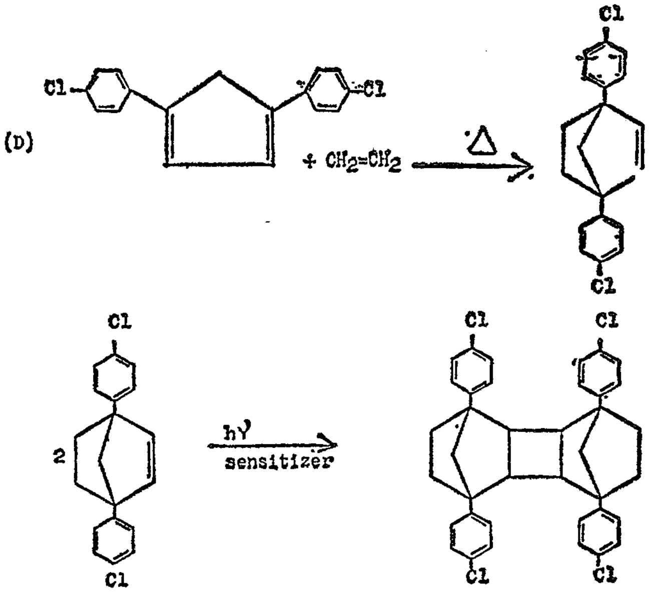

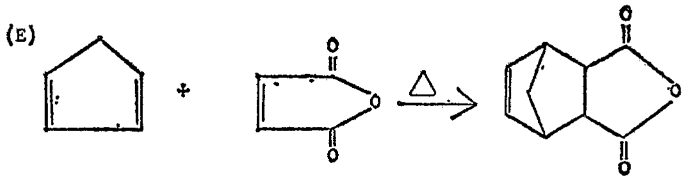

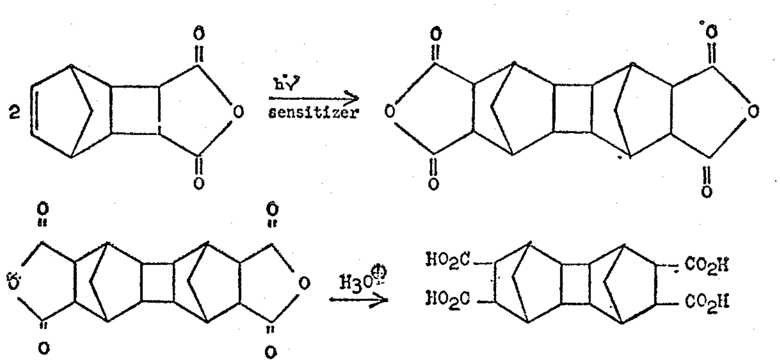

Equation E, above, illustrates the Diels Alder reaction between cyclopentadiene and maleic anhydride to provide 2-norbornene- 5,6-dicarboxylic acid anhydride which in turn may be reacted in the presence of the sensitizer and the proper energy source to produce the dimeric tetracarboxylic acid anhydride which through hydrolysis is converted to the tetracarboxylic acid.

The above reactions indicate the introduction of different functional groups to the dimer compound. These functional radicals can be further treated by conventional organic synthesis to introduce other substituents on the basic alicyclic dimer structure of this invention. Illustrative reactions which may be employed in the practice of the present invention are characterized by the following wherein the radicals in the equations possessing the free valence is directly bonded to the ring structure VII(a) at any one of or all of the free valences thereof (VIIa)

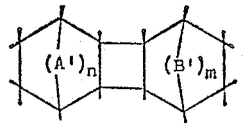

wherein A′ and B′ are one of the radicals $$-\overset{|}{\underset{|}{C}}- \text{ and } -\overset{|}{\underset{|}{C}}-\overset{|}{\underset{|}{C}}-$$

and *n* and *m* are as defined above:

$$-Cl \xrightarrow{2Li} LiCl + -Li$$

$$-Li \xrightarrow{CO_2} -CO_2Li$$

$$-CO_2Li \xrightarrow{H_2O} -CO_2H + LiOH$$

$$-CO_2H \xrightarrow{(R_3)_2NH} -\overset{\ominus}{C}O_2\overset{\oplus}{N}H_2(R_3)_2$$

$$-\overset{\ominus}{C}O_2\overset{\oplus}{N}H_2(R_3)_2 \xrightarrow{\Delta} -CON(R_3)_2 + H_2O$$

$$-CO_2H \xrightarrow{LiAlH_4} -CH_2OH$$

$$-CH_2OH \xrightarrow{SOCl_2} -CH_2Cl + SO_2 + HCl$$

$$-CH_2OH + o\ \overset{O}{CH_2-CH_2} \longrightarrow -CH_2O(CH_2CH_2O)_oH$$

o=1 to 20,000

$$-CN \xrightarrow{H_3O^{\oplus}} -CO_2H$$

$$-CN \xrightarrow[Ni]{H_2N/H_3} -CH_2NH_2$$

$$-CH_2NH_2 + Cl-\overset{O}{\overset{\|}{C}}-CH_3 \longrightarrow -CH_2-NH-\overset{O}{\overset{\|}{C}}-CH_3 + HCl$$

$$-CH_2NH_2 + Cl-\overset{O}{\overset{\|}{C}}-Cl \longrightarrow -CH_2-NH-\overset{O}{\overset{\|}{C}}-Cl + HCl$$

$$-CH_2Cl + Mg/ether \longrightarrow \xrightarrow{SiCl_4} -CH_2-SiCl_3$$

or -Cl → or -SiCl₃

$$-CH_2SiO_{3/2} \text{ or } -SiO_{3/2} \xleftarrow[KOH]{H_2O}$$

$$-Cl + R-Li \xrightarrow{Ether} -R + LiCl$$

$$-Cl + NaNH_2/NH_3 \longrightarrow -NH_2 + NaCl$$

$$-NH_2 + HO_2C-R'''-CO_2H \longrightarrow$$

$$-\overset{\oplus}{N}H_3\overset{\ominus}{O}_2C-R'''-CO_2H \xrightarrow{heat} \text{amide}$$

$$-NH_2 + 2\overset{O}{CH_2-CH}(CH_3) \longrightarrow -N(CH_2-CH(CH_3)-OH)_2$$

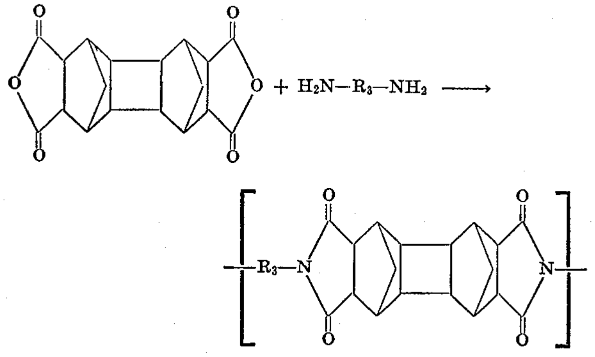

$$-NH_2 + Cl-\overset{O}{\overset{\|}{C}}-Cl \longrightarrow -NH-\overset{O}{\overset{\|}{C}}-Cl + HCl$$

$$-NH-\overset{O}{\overset{\|}{C}}-Cl \xrightarrow{NH_3} -NH-\overset{O}{\overset{\|}{C}}-NH_2$$

$$-NH-\overset{O}{\overset{\|}{C}}-Cl \xrightarrow{C_2H_5OH} -NH-\overset{O}{\overset{\|}{C}}-OC_2H_5 + HCl$$

$$-Cl + H_2S \longrightarrow HCl + -SH$$

$$-SH + CH_3CO_3H \longrightarrow -SO_3H \xrightarrow{KOH} -SO_3K$$

$$-SO_3K + (R_3)_3\overset{+}{N}Cl^- \longrightarrow -\overset{\ominus}{S}O_3\overset{\oplus}{N}(R_3)_3 + KCl$$

$$-CH{=}CH_2 + CH_3CO_3H \longrightarrow -\overset{O}{CH-CH_2}$$

$$\xrightarrow{H_3O^+} -\underset{OH}{CH}-\underset{OH}{CH_2}$$

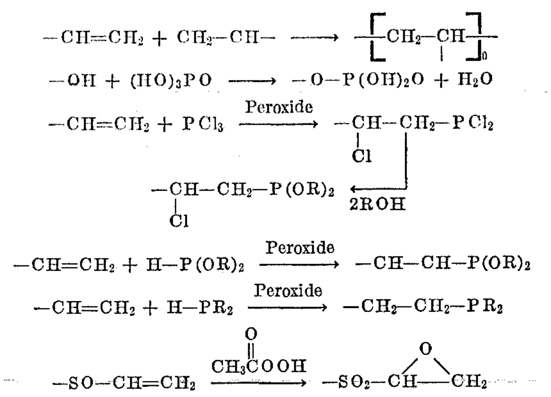

The basic dimeric norbornene, cyclohexene and/or cyclo(2.2.2)octene, independent of these functional or non-functional substituents thereon, are very useful compounds. They are fairly stable at high temperatures and can be utilized as lubricants. The presence of nonfunctional substituents such as alkyl, aryl, and the like radicals does not alter this utility. In addition these materials may be utilized as fuels. They represent a very compact molecule which gives off a large amount of energy during combustion.

The functional reactants possess considerable utilities. For example the phosphorous substituted compounds, such as the phosphines and phosphates, are usable as lubricants, pour point depressants, as reactants in polymerization reactions (particularly with regard to the phosphate), as plasticizers for vinyl polymers, and the like uses. The amino substituents are useful per se as insecticides and can be utilized as organic hardeners for the conversion of conventional epoxy resins, such as those based on the reaction of epichlorohydrin and Bisphenol A. This is also irrespective of whether the dimer is monoamino or polyamino substituted compound. The polyamino, particularly the diamino, substituted compounds can be utilized for the production of polyamide resins of the nylon type by reaction with dicarboxylic acids, anhydrides or acid halides such as adipic acid, succinic acid, sebacic acid, and the like, to produce very useful fiber forming polyamides. In addition, the dianhydride, such as illustrated above, can be reacted with diamines to make polyimides having extremely high second-order transition temperatures as well as high melting points. Such polyimides are useful in the formation of fibers which can be utilized in making fabrics that can be dry ironed at high temperatures. As a rule, one can expect polyimides having second-order transition temperatures on the order of 125° C. and greater. The diol containing dimeric products characterized above may be utilized in the formation of polymers by reaction with, e.g., terephthalic acid, adipic acid, their anhydrides or acid halides, or a mixture of such acids and/or organic diisocyanates, e.g., tolylene diisocyanates. The resulting polyester, polyurethane, and/or polyester polyurethane are extremely useful in the formation of hard abrasion resistant coatings and elastic fibers and films (only in the case of the polyurethanes and polyesterpolyurethanes) which have a considerable utility in the art.

To illustrate the wide utility of the compounds of this invention, the novel diols, dicarboxy, and diamines described above may be interacted to produce extremely useful elastomeric fibers and coatings. For example, the diol

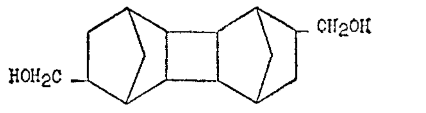

may be reacted (e.g. by heating) in slight excess of equimolar amounts with the diacylchloride

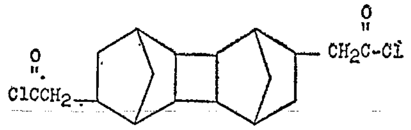

to produce a polyester of the formula:

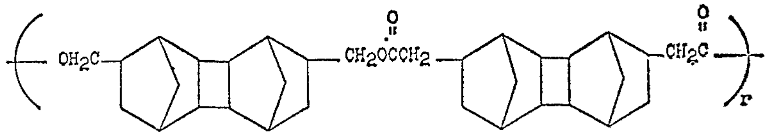

wherein *r* is a whole number sufficiently large to provide a polyester having a molecular weight of e.g., above 500, preferably above about 1000. The hydroxy terminated polyester variety of the above polyester may be reacted with ,e.g., the diisocyanate, such as tolylene diisocyanate, bis(4-isocyanatophenyl)methane, and the like wherein the diisocyanate is provided in stoichiometric excess. For example, from about 1.33 to 2.5 moles of the diisocyanate per mole of polyester may be interreacted. There results an isocyanato end-blocked (or terminated) polyester-polyurethane. The polyesterpolyurethane may be reacted on about an equimolar basis with, e.g., a diamine of the formula

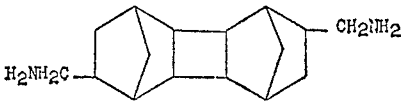

to form a most desirable light stable polyesterpolyureylpolyurethane which can be cast into films and molded into usable articles.

In addition, any one of the above reactants may be substituted by complimentary reactants devoid of the novel alicyclic moiety. For example, the novel diol may be substituted by alkanediols (e.g., ethylene glycol, tetramethylene glycol, hexamethylene glycol, etc.) and/or the novel diacylchloride or dicarboxylic acid may be substituted by alkylenedicarboxylic acids, their anhydrides or acid chlorides. When such is done, the polymer tends to become more softer, usually more elastomeric and elastomeric fibers and films may be produced therefrom. Such is particularly the case when the novel diamines are substituted by, e.g., hydrazine and alkylene diamines, such as ethylene diamine, tetramethylene diamine, hexamethylene diamine, and the like. However, in that case where the hydroxy end-blocked or terminated polyester is made substantially of acyclic diol and dicarboxylic acid, then it is desirable that the polyester have a molecular weight of at least 500, particularly between 700 to 8,000. Usually, regardless of the polyester composition employed to produce these novel polyesterpolyureyl-polyurethanes their molecular weight should not exceed about 14,000.

As indicated above, the novel alicyclic diamines may be reacted with either the novel alicyclic dicarboxylic acids of this invention or with aromatic or acyclic dicarboxylic acids to produce fiber and film forming polyamides. By the same token, the novel alicyclic dicarboxylic acids or acid halides can be reacted with aromatic or acyclic diamines to produce fiber and film forming polyamides. Diamines and dicarboxylic acids, other than the aforedefined alicyclic diamines and dicarboxylic acids, which may be employed as just mentioned above include, e.g., ethylene diamine, tetramethylene diamine, pentamethylene diamine, hexamethylene diamine, decamethylenediamine, piperazine, 2,5-dimethylpiperazine, 1,4-phenylene diamine, etc., oxalic acid, malonic acid, maleic acid, fumaric acid, succinic acid, adipic acid, sebacic acid, suberic acid, dimerized linoleic acid, dimerized oleic acid, and the like. The polyamide may be formed by conventional melt polymerization in bulk, solution or suspension. The polyamides may also be formed at lower temperatures by first forming the diammonium salt, partially polymerize in the presence of water and then finish off the polymerization at temperatures above 100° C. but below the melting point of the polymer, i.e., effect solid state polymerization. The polyamides may be also be produced by the well known interfacial polymerization technique.

In addition to polyamides from the alicyclic polycarboxylic acids and diamines, polyamides may be also produced from novel sulfonyl and phosphonyl alicyclic compounds, such as

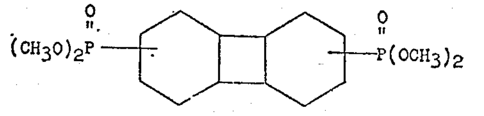

and

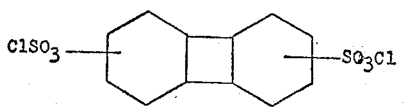

and the aforementioned diamines to produce polyphosphonamides and polysulfonamides possessing film forming characteristics.

The novel epoxides of this invention, such as

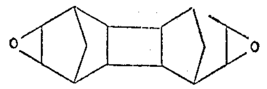

and

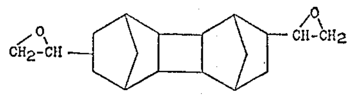

may be utilized for making hard, solvent and acid or base resistant coatings and adhesives or can be utilized, in admixture with other epoxy systems, such as the bis-phenol-A-epichlorohydrin reaction products

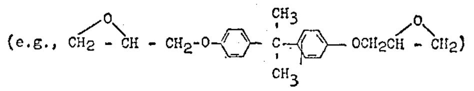

or 3,4 - epoxy - 6 - methylcyclohexylmethyl-3,4-epoxy-6-methylcyclohexanecarboxylate, to produce useful flexible, acid and alkali resistant coatings and adhesives.

The epoxides, that is, alicyclic compounds possessing oxirane groups, are produced from the novel alicyclic ethylenically unsaturated compounds described previously by reaction with organic peracids, such as peracetic acid. The peracid may be employed as a solution, typically in an inert organic liquid medium such as ethyl acetate, butyl acetate, acetone, and the like. The solution may contain peracid in amounts of from about 10 to about 50 percent, basis weight of solution, preferably from about 20 to about 40 percent by weight of peracid. The epoxidation can be conducted at about 0° C. to about 100° C., although higher and lower temperatures are included as operational. In most cases, temperatures ranging from about 25° C. to about 75° C. are preferred.

In a typical operation, the peracid is utilized in an amount to convert at least one ethylenic group to epoxy. An excess quantity of said peracid insures substantial epoxidation of the unsaturated compound. For instance, from about 1.1 to about 5, or higher, moles of peracid per ethylenic group can be employed with advantageous results, though, of course, lower and higher ratios of peracid per group is within the purview of this invention. It should be appreciated that the ethylenically unsaturated alicyclic compound may contain other radicals capable of reaction with the peracid, such as sulfide to sulfone or sulfoxide, tertiary amino to the amine oxide, and the like. Thus, the amount of peracid should be sufficient to insure epoxidation when these radicals compete with the ethylenic groups for oxygen.

The novel epoxy compounds herein are cured in the same manner as other epoxy resinous compounds. The novel epoxides may be reacted with acid or basic catalysts to cause polymerization and solidification. The acidic and basic catalysts which can be employed include Lewis acids of the non-metal and metal halide class, such as boron trifluoride, aluminum chloride, zinc chloride, stannic chloride, ferric chloride, boron trifluoride-piperidine complex, boron trifluoride-1,6-hexamethylene diamine complex, boron trifluoridemonoethylamine complex, boron trifluoride-dimethyl ether complex, boron trifluoride-diethyl ether complex, boron trifluoride-dipropyl ether complex, and the like; the strong mineral acids, e.g., hydrochloric acid, sulfuric acid, phosphoric acid, polyphosphoric acid, perchloric acid, and the like; the saturated straight, branched chain or cycloaliphatic hydrocarbon sulfonic acids and the aromatic hydrocarbon sulfonic acids, e.g., ethanesulfonic acid, propane-sulfonic acid, cyclohexane sulfonic acid, benzenesulfonic acid, toluenesulfonic acid, naphthalenesulfonic acid, lower alkyl (1 to 18 carbon atoms) substituted-benzenesulfonic acid, and the like; the alkali metal hydroxides, e.g., sodium hydroxide, potassium hydroxide, and the like; the alkali metal carbonates such as sodium, potassium and lithium carbonate, bicarbonate and/or sesquicarbonate, and thet like; the tertiary amines and quaternary ammonium compounds, e.g., alphamethylbenzyldimethylamine, dimethylethylamine, triethylamine, tripropylamine, tetramethylammonium hydroxide, benzyltrimethylamomnium hydroxide, and the like.

Catalyst concentration and temperature of reaction, as indicated above, typically affect the degree of polymerization and, as well, affect the rate of polymerization. For example, higher catalyst concentration and temperature usually promote faster reaction rates. The catalyst concentration, of course, is variable over a broad range depending upon the temperature of reaction employed and the degree and rate of polymerization desired. In general, a catalyst concentration may be employed of from about 0.005 to 15 percent, preferably from about 0.01 to 5 percent, basis weight of epoxide.

Also, polymerization can be effected through reaction with an organic regent. With respect to these organic reagents, typically contrary to the functioning of the catalyst system, the organic reagent becomes integrally bound in the resulting polymer, and for this reason, can be termed a copolymeric reactant. Of course, the variety of reactants will determine whether the polymer is termed a copolymer, a terpolymer, etc. The organic reagent possesses functional groups capable of reacting with the vicinal epoxy or capable of reacting with the derivative of the oxirane formed by utilizing an agent capable of splitting open the ring so as to provide a hydroxyl group. The reagent typically possesses a functional group which is directly bound to carbon and, in most cases, the reagent predominates in carbon and hydrogen relative to the molar quantity of other elements making up the reagent.

The reagent is capable, depending upon the amount employed, of inter-reaction with the epoxy compounds of this invention to produce in specific instances, thermoplastic and thermosetting resins either in liquid or solid state.

Illustrative organic reagents include polycarboxylic acids, carboxylic acid anhydrides, polyols, polyesters containing chain terminating hydroxyl or carboxyl groups, primary amines, polyamino compounds wherein at least two nitrogen atoms thereof contain at least one bonded hydrogen atom each, polythiols, polyisocyanates, polyisothiocyanates, polyacylhalides, and similar compounds possessing functional groups suitable for reaction with the epoxy groups contained in the compounds of this invention. Moreover, the reagents may be employed in conjunction with the aforementioned catalysts.

The aforementioned catalysts and reagents are frequently termed organic hardeners in that they cause a degree of polymerization which may result in a solid product.

The reagent can be added to the epoxy compounds of this invention by simple mixing therewith, desirably with sufficient vigor so as to provide a homogeneous mixture. The order of addition of the reagent and the epoxy compound in the mixing procedure does not appear critical though it is often found desirable to first add the component, i.e., the reagent or the epoxy compound, that has the lower viscosity. This will ensure more rapid mixing of the components. If either one or both of the components are solid, and mixing is effected in the absence of a solvent, heat may be applied to the solids in an amount sufficient to cause melting thereof and allow inter-mixture of the two components. The application of heat should not be prolonged to the extent that appreciable curing takes place during mixing.

The above class of organic reagents possess functionality in the form of reactive groups capable of splitting open the oxirane ring of the epoxy compounds or compositions of this invention, whereby to effect reaction therewith and cause the production of a resinous composition of a molecular weight greater than that of the starting epoxy composition or compound. The functional group of the polycarboxylic acids, their anhydrides or acid halides, is the carbonyloxy $$(-\overset{\overset{\displaystyle O}{\|}}{C}-O)$$

moiety. With respect to the polyols, the hydroxyl (—OH) group is the functional group. In the case of the polyesters, either the terminating carboxyl or hydroxyl groups represent its functionality. With respect to the amino compounds, the nitrogen having a bonded hydrogen represents the functional group. It is to be understood that if a nitrogen atom has two bonded hydrogens, the compound is at least difunctional. In the case of polythiols, the mercapto group is the functional group, and with polyisocyanates and polyisothiocyanates, the isocyanato or isothiocyanato moieties represent the functional groups.

The organic reagent may be employed in amounts so as to provide from about 0.001 to about 15.0, usually from about 0.01 to 5.0, functional groups thereof per vicinal epoxy group of said epoxy compounds and compositions of this invention. Desirably, a ratio of from about 0.1 to about 3.5 of the functional groups to the epoxy groups is employed. In preferred operation, this ratio is from 0.5 to 2.0. Oftentimes a 1 to 1 ratio of functional groups to epoxy group is found significantly desirable.

In many instances it is desirable to add the reagent to the epoxide composition in two steps. The first addition typically utilizes an amount of reagent whereby to provide a low ratio of functional groups per epoxide group, say from about 0.01 to about 0.8 so that the resulting condensation product has a viscosity indicating a low state of polymerization. This product is termed an intermediate stage resinous composition comparable to an A-stage resin. The ultimate molecular weight polymer obtainable from the reaction of a particular reagent and epoxide indicates whether an intermediate polymerized state is reached in any given instance.

Reaction between the reagent and the aforementioned epoxy compounds of this invention can be effected within a broad temperature range such as from about 20° C. to about 300° C. Higher and lower temperatures are also included. In most cases the reaction will be effected at between about 75° C. and 200° C.

The reaction may be effected in the presence or absence of a solvent. Of course, it is most desirable to effect the reaction at a temperature at which the components of the reaction are in liquid state. But if any of the components are not suitably usable in liquid state, it may be dissolved in a solvent therefor, and incorporated in the other component or components of the reaction. In most instances, a solvent can be employed to effect a partially polymerized composition which can be hardened by evaporating the solvent. Of course, this is restricted by the nature of the product which is dissolved. If the product of reaction between the epoxy compounds of this invention and the organic reagent form a thermosetting resinous composition free of ethylenic unsaturation capable of oxidizing to a cured state at low temperatures (such as those provided in fatty acids such as linoleic acid), then additional heat typically above 50° C. is necessary to achieve not only solvent evaporation, but complete thermoset of the resinous composition. On the other hand, if the resinous composition comprises a thermoplastic reaction product, simple evaporation of the solvent at any convenient temperature will result in a solid thermoplastic mass.

In any event, use of solvent in the polymerization reaction is oftentimes desirable regardless of the fusability of the reaction product. The solvent should be inert to the reactants or reaction product, liquid at the temperature of use and compatible with at least one of the reactants, preferably compatible with all of the components of the reaction as well as the resulting reaction product. The most desirable solvents are organic and include such chemicals as xylene, toluene, mineral spirits, specific aliphatic hydrocarbons such as n-hexane, n-heptane, n-octane, 2-ethyl hexane, methyl isobutyl ketone, methyl isopropyl ketone, ethyl acetate, butyl acetate, amyl acetate, and the like. It is preferred that the aforementioned esters not be used as a solvent during the reaction between the organic reagent and the epoxides. On the other hand, they are most desirably employed as a solvent for the product from the reaction of these two components.

Thermoplastic resins may be obtained by reacting the aforementioned reagents or catalysts with monoepoxides of the novel alicyclic compounds of this invention. In view of the monoepoxy functionality, a substantially linear polymer is obtainable. upon reaction with the aforementioned reagents and catalysts, particularly when the reagent possesses not more than two functional groups.

Thermoset resinous compositions are obtainable by reaction of the di-, tri-, tetra- and other poly-epoxides with the aforementioned reagents and catalysts, or the monoeopixde with a reagent having at least two functional groups. If the resinous compositions obtainable from reaction with the catalyst or reagents possess residual olefinic unsaturation, further cross-linking of the compositions can be effected by incorporating the aforementioned free-radical initiators and heating the composition to a final cure.

The epoxy products of this invention are significantly suitable for use as surface coating materials, molding resins, films, adhesives, and the like.

These products, as well as the thermoplastic materials may be utilized as surface coatings by the dissolution thereof in solvents and applying the solution to a solid surface. Upon the evaporation of the solvent a hard coating is obtained. The resinous materials may also be used for the manufacture of molded products by extrusion or casting molding techniques. This can be accomplished from a solvent solution or from an intermediate resinous state which is heated to effect a final cure.

Alicyclic compounds of this invention which contain carbon bonded hydroxy groups include those of the formula:

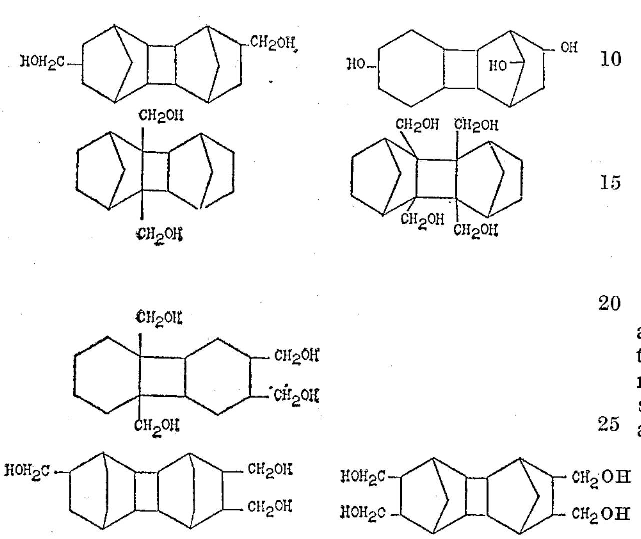

and the like. These hydroxy compounds may be used in the manufacture of polyurethane foams. In addition, the hydroxylated alicyclic compounds as well as amine and amide compounds of this invention containing active hydrogen may be reacted with alkylene oxides to add polyethers terminated with a hydroxy group on the alicyclic compounds. The alicyclic compounds are termed, in this case, to be initiating hydroxy and amino or amide compounds since they act as the start of a polyether chain. Other initiating compounds are within the purview of this invention and can be used to form polyurethane foams so long as at least one of the alicyclic compounds of this invention are employed.

Useful alkylene oxides include, e.g., various 1,2-alkylene oxides such as ethylene oxide, 1,2-propylene oxide, 1,2-butylene oxide, 1,2-hexylene oxide, 1,2-dodecylene oxide, cyclohexyl ethylene oxide, and styrene oxide, or mixtures thereof, may be polymerized by contact with a basic or acidic catalyst in the presence of the initiating compound. The aforementioned 1,2-alkylene oxides may be copolymerized with 1,3- and 1,4-alkylene oxides by acid catalytic polymerization in the presence of the initiating polyhydroxy organic compound. Illustrative of various 1,3- and 1,4-alkylene oxides include 1,3-pentylene oxide, 1,4-butylene oxide (tetrahydrofuran), 1,4-pentylene oxide, 1,4-octylene oxide, etc., and 1,4-epoxy 2-phenyl butane, and the like. The 1,3- and 1,4-alkylene oxides may be reacted above with the initiating compounds to form useful polyols.

Other initiating organic compounds may include 1,2-alkylene glycols, 1,3-alkylene glycols, 1,4-alkylene glycols, alkylene triols, alkylene tetrols, alkylene pentos, alkylene hexols, polyalkylene glycols, etc. Illustrative of these materials include ethylene glycol, 1,2- and 1,3-dihydroxy propane, 1,2- 1,3-, 1,4-dihydroxy butane, 1,2-, 1,3-, 1,4-dihydroxy pentane, 1,2-, 1,3-, 1,4-dihydroxy hexane, 1,2-, 1,3-, 1,4-dihydroxy decane, 1,2-, 1,3-, 1,4-dihydroxy octadecane, and the alpha, omega diols of the above hydrocarbon moieties not indicated as such. Polyalkylene glycols include diethylene glycol, triethylene glycol, tetraethylene glycol, 1,2- and 1,3-dipropylene glycol, 1,2- and 1,3-tripropylene glycol, 1,2-, 1,3- and 1,4-dibutylene glycol, 1,2-, 1,3-, and 1,4-tributylene glycol, etc. Triols which may be utilized as the initiating hydroxy organic compound include glycerol, 1,1,1 - trimethylolpropane, 1,2,3-trihydroxy butane, 1,2,3-trihydroxy pentane, 1,2,3-trihydroxy octane, 1,2,3-trihydroxy decane, 1,2,4-trihydroxy butane, 1,2,4-trihydroxy hexane, 1,2,6-trihydroxy hexane, 1,2,8-trihydroxy octane, and the like. Illustrative of other polyols which are suitable initiators include sorbitol, pentaerythritol, erythritol, aromatic hydroxy compounds of the formulae:

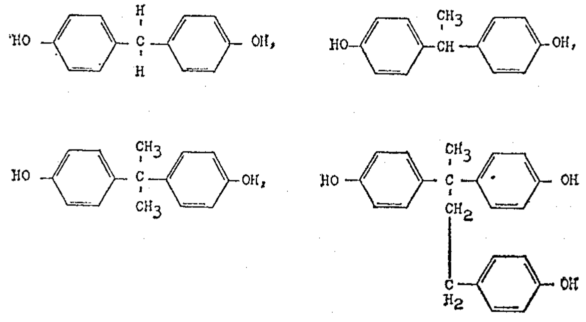

and the like, and the saturated (non-benzenoid) derivatives thereof; various other carbohydrates such as the monosaccharides and polysaccharides, e.g., cellulose, starch, glucosides, such as the lower alkyl (1 to 6 carbon atoms) glucosides, e.g., methyl-D-arabinoside, methyl-D-xyloside, ethyl-D-xyloside, n-butyl-D-riboside, methyl, ethyl, propyl, butyl, and 2 - ethyl-hexyl-D-glycoside, 2-ethylhexyl-D-fructoside, isobutyl-D-mannoside ethyl-D-galactoside, benzyl-D-glucoside and methyl-L-rhammoside; sucrose, glycose glycoside, maltose, lactose, D-glucose, D-idose, hydroxyethyl cellulose, amylose, amylopectin, dextrin, and the like.

Desirably, the initiator is admixed with the alkylene oxide in a liquid phase and the basic or acidic catalyst is dispersed throughout this phase. Suitable basic catalysts include alkali metal hydroxides such as sodium hydroxide and potassium hydroxide. Desirable acidic catalysts include Lewis acids such as boron trifluoride, aluminum chloride and the like. The catalyst is added in catalytic amounts, i.e., amounts sufficient to effect reaction between the alkylene oxide and the initiating hydroxylated compound. When the catalyst is alkali metal hydroxide, amounts of from about 0.2 to 1.0 percent by weight of the alkylene oxide reactant is convenient. When the catalyst is a Lewis acid, such as boron trifluoride, amounts of from about 0.01 to 1.0 percent by weight of the alkylene oxide reactant is suitable. The reaction can be effected at temperatures of from 80° C. to about 160° C. and advantageously under pressures ranging from about 5 to 50 pounds per square inch gauge. The reaction is preferably carried out under essentially moisture free (anhydrous) conditions to minimize side reaction. The addition of the alkylene oxide is terminated when the calculated quantities thereof have been introduced into the system.

Illustrative ether adducts of amino or amido alicyclic compound of this invention include, e.g.,

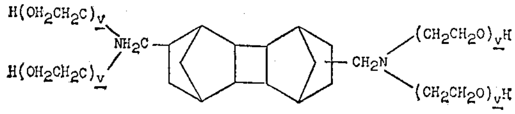

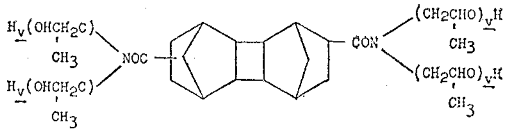

and the like.

The hydroxy terminated polyesters described above may be also used in the manufacture of polyurethane foams. Of course, polyisocyanates are employed to produce the foams herein which include as one of the components of the foam structure at least one of the alicyclic structures of the instant invention. Usable polyisocyanates include those disclosed in Siefken, Annalen 562, pages 122 to 135 (1949). Illustrative of particularly desirable polyisocyanates include the following:

tolylene-2,4 and 2,6-diisocyanate,
4,4′-methylene-di-ortho-tolylisocyanate,
2,4,4′-triisocyanatodiphenylether,
toluene-2,3,6-triisocyanate,
1-methoxy-2,4,6-benzenetriisocyanate,
meta-phenylenediisocyanate,
4-chloro-meta-phenylenediisocyanate,
4,4′-biphenyldiisocyanate,
1,5-naphthalenediisocyanate,
1,4-tetramethylenediisocyanate,
1,6-hexamethylenediisocyanate,
1,10-decamethylenediisocyanate,
1,4-cyclohexanediisocyanate,
1,2-ethylenediisocyanate,
diphenylmethane-p:p′ or m:m′-diisocyanate,
bis(4-isocyanatocyclohexyl)methane,
stilbene diisocyanates,
dixylylmethane diisocyanates,
2,2-bis(4-isocyanatophenyl)propane,
diphenylmethane tetraisocyanates,
trimethylbenzene triisocyanates,
ditolylmethane triisocyanates,
triphenylmethane triisocyanates,
3,3′-dimethyldiphenylene-4,4′-diisocyanate,
3,3′-dimethoxy-diphenylene-4,4′-diisocyanate,
diphenyl triisocyanates and
diphenylcyclohexane-p:p′-diisocyanate.

The preferred isocyanates are the tolylene diisocyanates and the diphenyl methane diisocyanates.

Reaction between the polyisocyanates and the active hydrogen-containing compounds may be effected at temperatures ranging from 0° C. to 250° C., preferably from 25° C. to 150° C. The reaction is effected by intermixture of the components of the reaction, followed by heating of the mixture, if necessary.

The molecular weight and the hydroxyl number of the polyether polyol and polyester polyol when used for reaction with a polyisocyanate to form polyurethane foams will typically determine whether the resulting foam product is flexible or rigid. For example, the above polyols which possess a hydroxyl number of from about 200 to about 1000 are typically employed in rigid foam formulations, while those polyols having a hydroxyl number of from about 20 to about 150 or more are usually employed in flexible foam formulations. Such limits are not intended to be restrictive and are merely illustrative of the potential selectivity of the above polyol co-reactants. Other modifications of possible polyol combinations will be readily apparent to those having ordinary skill in the art.

The hydroxyl number, as used hereinabove, is defined by the equation:

$$OH=\frac{f\times 1000\times 56.1}{\text{molecular weight}}$$

wherein OH is the hydroxyl number of the polyol, $f$ represents functionality (i.e., average number of hydroxyl groups per molecule of polyol), and molecular weight is the average molecular weight of the polyol.

Methods for making the aforementioned polyurethane flexible foams are well documented in the art.

When preparing the foamed products, either the quasi-prepolymer technique or the one-shot technique can be employed. Both techniques are known in the art.

Foaming can be accomplished by employing a small amount of water in the reaction mixture (for example, from about 0.5 to 5 weight percent of water, based on total weight of the reaction mixture), or through the use of blowing agents which are vaporized by the exotherm of the isocyanate-hydroxyl reaction, or by a combination of the two methods. All of these methods are known in the art. The preferred blowing agents are certain halogen-substituted aliphatic hydrocarbons which have boiling points between about −40 C. and 70° C., and which vaporize at or below the temperature of the foaming mass. These blowing agents include, for example, trichloromonofluoromethane,
dichlorodifluoromethane,
dichloromonofluoromethane,
dichloromethane,
trichloromethane,
bromotrifluoromethane,
chlorodifluoromethane,
chloromethane,
1,1-dichloro-1-fluoroethane,
1,1-difluoro-1,2,2-trichloroethane,
chloropentafluoroethane,
1,1,1-trifluoro-2-chloroethane,
1-chloro-1-fluoroethane,
1,1,1-trichloro-2,2,2-trifluoroethane,
1,1,2-trichloro-1,2,2-trifluoroethane,
1-chloro-2-fluoroethane,
2-chloro-1,1,1,2,3,3,4,4,4-nonafluorobutane,
hexafluorocyclobutane, and
octafluorocyclobutane.

Other useful blowing agents including low-boiling hydrocarbons such as butane, pentane, hexane, cyclohexane, and the like. Many other compounds easily volatilized by the exotherm of the isocyanate-hydroxyl reaction can also be employed. A further class of blowing agents includes thermally-unstable compounds which liberate gases upon heating, such as N,N′-dimethyl-N,N′-dinitrosoterephthalamide.

The amount of blowing agent used will vary with the density desired in the foamed product. In general, it may be stated that for 100 grams of reaction mixture containing an average NCO/OH ratio of about 1:1, about 0.005 to 0.3 mole of gas are used to provide foams having densities ranging from 30 to 0.8 pounds per cubic foot, respectively.

A conventional catalyst can be employed in the reaction mixture for accelerating the isocyanate-hydroxyl reaction. Such catalysts include a wide variety of compounds such as, for example, (a) tertiary amines such as trimethylamine, 1,2,4-trimethylpiperazine, 1,4-dimethylpiperazine, N-methylmorpholine, N-ethylmorpholine, N,N-dimethylbenzylamine, bis(dimethylaminomethyl)amine, N,N-dimethylethanolamine, N,N,N′,N′-tetramethyl-1,3-butanediamine, triethanolamine, 1,4-diazabicyclo[2.2.2]octane, and the like; (b) tertiary phosphines such as trialkylphosphines, dialkylbenzylphosphines, and the like; (c) strong bases such as alkali and alkaline earth metal hydroxides, alkoxides and phenoxides; (d) acidic metal salts of strong acids such as ferric chloride, stannic chloride, stannous chloride, antimony trichloride, bismuth nitrate and chloride, and the like; (e) chelates of various metals such as those which can be obtained from acetylacetone, benzoylacetone, trifluoroacetylacetone, ethyl acetoacetate, salicylaldehyde, cyclopentanone-2-carboxylate, acetylacetoneimine, bis-acetyl-acetonealkylenediamines, salicylaldehydeimine, and the like, with various metals such as Be, Mg, Zn, Cd, Pb, Ti, Zr, Sn, Sb, As, Bi, Cr, Mo, Mn, Fe, Co, Ni, or such ions as $MoO_2^{++}$, and the like; (f) alcoholates and phenolates of various metals such as $Ti(OR)_4$, $Sn(OR)_4$, $Sn(OR)_2$, $Al(OR_3)$, and the like, wherein R is alkyl or aryl, and the reaction products of these alcoholates with carboxylic acids, beta-diketones and 2-(N,N-dialkylamino) alkanols, such as the well-known chelates of titanium obtained by said or equivalent procedures; (g) salts of organic acids with a variety of metals such as alkali metals, alkaline earth metals, Al, Sn, Pb, Mn, Co, Ni and Cu, including, for example, sodium acetate, potassium laurate, calcium hexanoate, stannous acetate, stannous octoate, stannous 2-ethylhexanoate, stannous oleate, lead octoate, metallic driers such as magnanese and cobalt naphthenate, and the like; (h) organometallic derivatives of tetravalent tin, trivalent and pentavalent As, Sb and Bi, and metal carbonyls of iron and cobalt. Among the organotin compounds that deserve particular mention are dialkyltin salts of carboxylic acids, e.g., dibutyltin diacetate, dibutyltin dilaurate, dibutyltin maleate, dilauryltin diacetate, dioctyltin diacetate, dibutyltin-bis[4-(N,N'-dimethylamino)benzoate], dibutyltin-bis[6-(N-methylamino)caproate], and the like. Similarly, there can be used a trialkyltin hydroxide, dialkyltin oxide, dialkyltin dialkoxide, or dialkyltin dichloride. Examples of these compounds include tri- The copolymers generally contain from 5 to 95 weight percent, and preferably from 5 to 50 weight percent of polysiloxane polymer with the remainder being polyoxyalkylene polymer. The copolymers can be prepared, for example, by heating a mixture of (a) a polysiloxane polymer containing a silicon-bonded, halogen-substituted monovalent hydrocarbon group, and (b) an alkali metal salt of a polyoxyalkylene polymer, to a temperature sufficient to cause the polysiloxane polymer and the salt to react to form the block copolymer. Although the use of an emulsifier is desirable to influence the type of foam structure that is formed, the foam products of the invention can be prepared without emulsifiers in some cases.

The unsaturated alicyclic compounds of this invention may be converted to resins by, e.g., free radical or ionic polymerization reactions. Illustrative unsaturated alicyclic compounds include, e.g.,

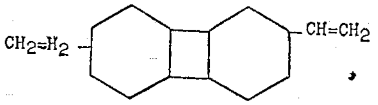

,
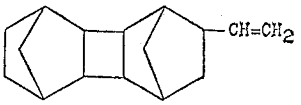

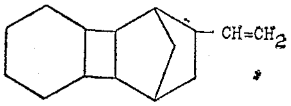

,
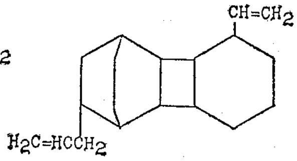

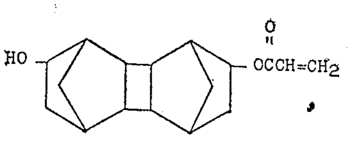

,
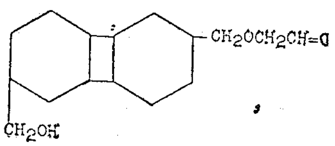

,

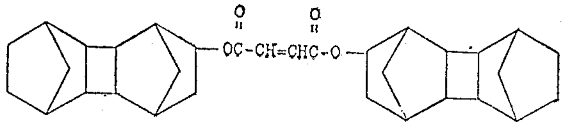

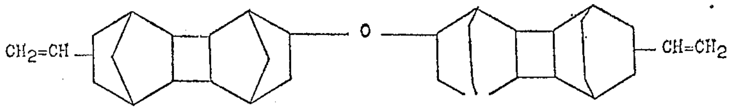

methyltin hydroxide, tributyltin hydroxide, trioctyltin hydroxide, dibutyltin oxide, dioctyltin oxide, dilauryltin oxide, dibutyltin-bis(isopropoxide), dibutyl-tin-bis(2-diethylaminopentylate), dibutyltin dichloride, dioctyltin dichloride, and the like.

The tertiary amines may be used as primary catalysts for accelerating the active hydrogen-isocyanate reaction or as secondary catalysts in combination with metal catalysts. The catalysts are employed in small amounts, for example, from about 0.001 percent to about 5 percent, based on the weight of the reaction mixture.

It is also desirable to employ small amounts, e.g., about 0.001 percent to 5.0 percent by weight, based on the total reaction mixture, of an emulsifying agent such as siloxane-oxyalkylene block copolymer having from about 10 to 80 percent by weight of siloxane polymer and from 90 to 20 percent by weight of alkylene oxide polymer, such as the block copolymers described in United States Patent Nos. 2,834,748 and 2,917,480.

Another useful class of emulsifiers are the "non-hydrolyzable" polysiloxane-polyoxyalkylene block copolymers. This class of compounds differs from the above-mentioned polysiloxane-polyoxyalkylene block copolymers in that the polysiloxane moiety is bonded to the polyoxyalkylene moiety through direct carbon to silicon bonds, rather than through carbon to oxygen to silicon bonds.

and the like. Such may be homopolymerized or interpolymerized to form useful addition polymers. Interpolymeric reactants include the novel alicyclic compounds; vinyl compounds such as vinyl chloride, ethylene, acrylic acid, methacrylic acid, acrylonitrile, maleic acid, bis(isocyanatoethyl) fumarate, butadiene-1,3- styrene, vinyltrichlorosilane, vinyltrimethylsilane, and the like; vinylidene compounds such as vinylidene-cyanide, vinylidene chloride, alpha-methylene malonic acid, and the like.

Preferably, the polyunsaturated alicyclic compounds are reacted with mono-unsaturated organic compounds and the mono-unsaturated alicyclic compounds are polymerized with mono and/or polyunsaturated compounds. The polymerization may be effected in bulk, suspension or solution using peroxide catalysts, e.g., benzoyl peroxide, dicumylperoxide, hydrogenperoxide, etc., redox catalyst systems, e.g., the iron chloride-sulfate systems with or without amines, etc.; ionic catalyst systems such as the Friedel-Crafts catalyst, e.g., $AlCl_3$, $FeCl_3$, etc.

The resinous products of this invention may be admixed with a plurality of filler and/or pigmentary materials as, e.g., siliceous pigments such as hydrated silica, aerogels, xerogels, or fumed silica; titanium dioxide pigment; aluminum pigment, pigmentary or filler clays, and the like.

The resinous compositions may also be blended with other resins whereby to modify the characteristics of the products of this invention. Thus, the resins of this invention may be intermixed with nitrocellulose lacquers, conventional alkyd resins; vinyl chloride polymers, vinyl acetate polymers, vinyl alcohol polymers, polyacrylates such as polyethylacrylate, polyacrylamides such as copolymers of acrylamide and butylacrylate reacted with formaldehyde, and the like.

Broadly speaking, the polymers above described possess as an integral structure thereof, the polyvalent radical:

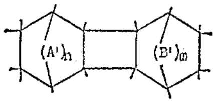

wherein A', B', $n$ and $m$ are as described previously. Particularly desirable are polymeric resinous compositions, as described above, possessing as an integral structure thereof, the polyvalent radical and unit:

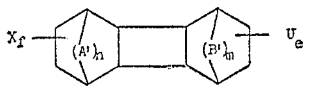

wherein X, U, A', B', $m$ and $n$ are as described above, $f$ and $e$ are integers of from about 8 to about 12, and the free valences of said radical not interbonded with the remainder of said polymeric composition is directly bonded to one of X and U.

More particularly definitive of the polymeric compositions encompassed by the present invention, is the composition possessing the unit formulae:

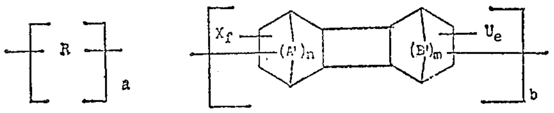

wherein R is a polyvalent radical, preferably an organic radical, $a$ is one of zero and a positive integer and $b$ is a positive integer, X, U, A', B', $m$, $n$, $f$ and $e$ are defined previously, and the free valences of said unit formulae other than for R and not interbonded with R is directly bonded to one of X and U.

The following examples serve to illustrate specific embodiments of this invention which are not intended to limit the scope of this invention.

EXAMPLE I

The apparatus herein comprises a quartz immersion well, fitted with a heat resistant glass filter (obtainable from Hanovia Chemical and Manufacturing Company, Newark, N.J.), which well is immersed in a 200 milliliter heat-resistant glass reactor containing a nitrogen gas bubbler at the bottom. The reactor is temperature controlled by a water bath, which in this example is maintained at about 8° C. The water from the bath, at the same temperature, is also circulated through the quartz immersion well. The light source is a Hanovia 450 watt high pressure mercury arc.

A solution of 9.4 grams of norbornene and 1.2 grams of acetophenone in 190 milliliters of benzene is irradiated in the above apparatus for 48 hours. Nitrogen is slowly bubbled through the solution during irradiation. The benzene is then removed under reduced pressure on a rotary evaporator and the residue is chromatographed on 100 grams of alumina eluting with n-hexane. The desired dimer comes off the column in the first fractions and usually crystallizes upon removel of solvent. The yield is 6.5 grams (70 percent theoretical yield) of

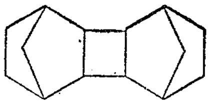

having a melting point of 36 to 40° C. After recrystallization from acetone using Dry Ice to induce crystallization colorless plates are obtained having a melting point of 41.5 to 42° C. (uncorrected).

*Analysis.*—Calc'd for (percent): C, 89.29; H, 10.71. Found (percent): C, 89.31; H, 10.44.

The above reaction may be also effected in a simple heat resistant glass reactor in the presence of sunlight as the radiation source. Moreover, the above procedure is employable for making

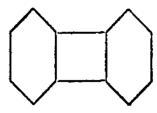

from cyclohexane; making

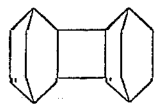

from

making

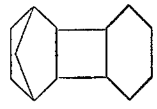

from a mixture of cyclohexene and 2-norbornene; and the like.

EXAMPLE II

Employing the procedure of Example I, a solution of 163 grams (1.37 moles, 77.2 percent exo and 22.8 percent endo) bicyclo[2.2.1]hept-2-ene-5-carbonitrile i.e.,

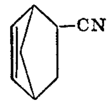

17 grams (0.14 mole) acetophenone and 300 milliliters benzene is photolyzed for 72 hours at 13± 1° C. Distillation of benzene under reduced pressure (80–85° C. at 10 millimeters Hg) provides a total of 99.7 grams of unreacted bicyclo[2.2.1]hept-2-ene-5-carbonitrile and acetophenone. The very viscous residue (82.5 grams, 50.7 weight percent yield) has the formula

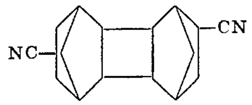

*Analysis.*—Calculated for $C_{16}H_{18}N_2$ (percent): C, 80.63; H, 7.54; N, 11.83; molecular weight, 238. Found (percent): C, 80.39; H, 7.75; N, 11.68; molecular weight, 269.

An infrared spectrum of the residue indicates that no norbornene double bond is present and the only absorption attributable to a functional group is that of the nitrile. Nuclear magnetic resonance analysis indicates that no norbornene olefinic protons (ca. 4$\tau$) are present. Moreover, bromine and permanganate exhibit negative results.

Polycyanocycloaliphatic ethylenically unsaturated compounds may be similarly dimerized (cycloadded).

EXAMPLE III

The residual reaction product of Example II containing dodecahydro-1,4:5,8-dimethanobiphenylene-2,6(or 7)-dicarbonitrile (75 grams, 0.315 mole) is taken up in isopropyl alcohol (750 milliliters) and placed in a 3-liter stainless-steel rocking autoclave with Raney nickel (15 grams). Ammonia (22 grams, 1.29 mole) is added from a small cylinder and the temperature is raised to 125° C. Then, by addition of hydrogen, the pressure is raised to 300 pounds per square inch. After 75 minutes, the temperature is elevated to 150° C. and, by further addition of hydrogen, the pressure is increased to 400 pounds per square inch. After 4.25 hours, a second charge of Raney nickel (15 grams) is added, and the mixture is hydrogenated as before at 150° C. for 9 hours. Following a drop in pressure, a third increase of hydrogen (to 450 pounds per square inch) is effected for a short period. After filtration to remove the catalyst, the reaction mixture is concentrated to give 75.2 grams of brown oil (98.2 weight percent crude yield). This reduction step is repeated on a second charge of the dinitrile. Then, the combined diamines (135 grams) are distilled to evaporation at 200° C. (ca. $10^{-2}$ millimeters Hg). The resulting 2,6(or 7)-dimethylaminododecahydro-1,4:5,8 - dimethanobiphenylene (72.6 grams recovery) having the formula

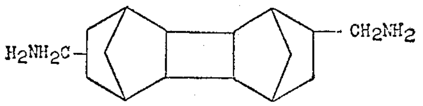

gives an amine titration of 91.6 percent of theoretical.

*Analysis.*—Calc'd for $C_{16}H_{26}N_2$ (percent): C, 77.99; H, 10.64; molecular weight, 246. Found (percent): C, 77.79; H, 10.51; molecular weight, 239.

EXAMPLE IV

Employing the procedure of Example I, a solution of 5-chloromethylbicyclo[2.2.1]hept-2-ene (214 grams; 1.50 moles) and acetophenone (18 grams; 0.15 mole) in benzene (350 milliliters) is flushed with nitrogen for 0.5 hour and photolyzed for 75 hours. Temperature varies from 15–32° C. during photolysis. After the benzene is rapidly removed by distillation, unreacted 5-chloromethylbicyclo [2.2.1]hept-2-ene (162.5 grams; 1.14 mole) and acetophenone (9.7 grams) is recoverd by distillation under reduced pressure (75–78° C. at 20 millimeters Hg, 90° C. at 1 millimeter Hg). Continued distillation affords a mixture of isomers of 2,6(or 7)-di(chloromethyl)dodecahydro-1,4:5,8-dimethanobiphenylene, i.e.,

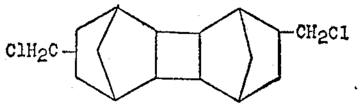

which is contaminated with carbonyl-containing materials (35.5 grams, 69.3 percent efficiency disregarding presence of ketone contaminants). Material balance accounts for 96 percent of the starting reactants. Another run, in which redistilled 5-chloromethylbicyclo[2.2.1] hept-2-ene (500 grams) and acetophenone (50 grams) are irradiated in the absence of benzene (72 hours, 21–22° C.), affords upon careful distillation through a 24-inch spinning band column, pure isomers of 2,6(or 7)-di(chloromethyl)dodecahydro-1,4:5,8 - dimethanobiphenylene (boiling point 168–173° C. at 0.6 millimeter Hg, $n_D^{20}$ 1.5482–1.5492).

*Analysis.*—Calc'd for $C_{16}H_{22}Cl_2$ (percent): C, 67.37; H, 7.78; Cl, 24.85; molecular weight, 285. Found (percent): C, 67.69; H, 7.87; Cl, 24.64; molecular weight, 284.

The infrared spectrum indicates C—Cl stretching at 708 cm.$^{-1}$ and no norbornene double bond absorption at 1570 cm.$^{-1}$. No other characteristic functional group absorption in the infrared. Nuclear magnetic resonance analysis confirms the absence of the norbornene double bond (no signal at ca. 4$\tau$). Standard chemical tests for unsaturation are negative.

The same procedure may be employed for the dimerization of a mixture 5,6-dichlorobicyclo[2.2.1]hept-2-ene and cyclohexene.

EXAMPLE V

Employing the procedure of Example I, a solution of 5,5-dimethylbicyclo[2.2.1]hept-2-ene (197 grams, 1.62 mole) and acetophenone (19.2 grams, 0.16 mole) in benzene (350 milliliters) is irradiated for 72 hours. The temperature is varied from 35–38° C. during the photolysis. After the benzene is stripped from the reaction mixture, unreacted monomer (128.2 grams) and acetophenone are distilled in vacuo. Continued distillation affords 2,2,6,6(or 2,2,7,7)-tetramethyldodecahydro - 1,4:5,8 - dimethanobiphenylene (63.1 grams, 0.259 mole, 32 percent yield, 91.3 percent efficiency). A small amount of viscous residue (6.4 grams) remains. Crystallization of the distillate from acetone gives white plates that melt at 99–100° C. Repeated sublimations give crystals that melt at 99–142° C. Analysis by vapor phase chromatography demonstrates that the dimeric product is composed of numerous isomers.

*Analysis.*—Calc'd for $C_{18}H_{28}$ (percent): C, 88.45; H, 11.55; molecular weight, 244. Found (percent): C, 88.15; H, 11.55; molecular weight, 242.

The presence of the gem-dimethyl group is confirmed by infrared spectroscopy (doublet at 1380 and 1389 cm.$^{-1}$), which also indicates the absence of the norbornene double bond (no absorption at 1570 cm.$^{-1}$). No other characteristic functional group absorption appears in the infrared. Nuclear magnetic resonance analysis confirms the absence if norbornene protons (no signal at ca. 4$\tau$).

EXAMPLE VI

Employing the procedure of Example I, a solution of 5-vinylbicyclo[2.2.1]hept-2-ene (140 grams; 1.17 moles), acetophenone (14.4 grams, 0.12 mole) and para-t-butylcatechol (0.20 gram, $1.2\times10^{-3}$ mole) in benzene (400 milliliters) is photolyzed for 70.5 hours. During this period, the temperature ranges between 20 and 29° C. The reaction mixture yields, upon distillation acetophenone, unreacted 5-vinylbicyclo[2.2.1]hept-2-ene (54.7 grams, boiling point 31° C. at 7 millimeters Hg) and a mixture of dimeric products (13.6 grams, 0.056 mole, boiling point 136–152° C. at 0.8 millimeter Hg; 9.7 percent yield; 21.4 percent efficiency). A viscous residue (43.5 grams) remains. Based on distillation recovery and vapor phase chromatography analysis of intermediate fractions, the unreacted monomer totals 76.7 grams. The dimers are carefully redistilled through a 24-inch spinning band column to afford analytical samples of 2,6( or 7)divinyldodecahydro-1,4:5,8-dimethanobiphenylene (boiling point 105–110° C. at 0.09 millimeter Hg, $n_D^{20}$ 1.5346–1.5348).

*Analysis.*—Calc'd for $C_{18}H_{24}$ (percent): C, 89.94; H, 10.06; molecular weight, 240. Found (percent): C, 89–46; H, 10.02; molecular weight, 241.

The dimeric mixture takes up 2.08 equivalents of hydrogen. The presence of the vinyl groups is established by infrared spectroscopy (1640, 992 and 907 cm.$^{-1}$). No characteristic norbornene absorptions (1570 and 708 cm.$^{-1}$) are detected.

EXAMPLE VII

Employing the procedure of Example I, a solution of 5-hydroxymethylbicyclo[2.2.1]hept-2-ene (450 grams, 3.63 moles), acetophenone (48 grams, 0.40 mole) and t-butylpyrocatechol (7 grams, 0.04 mole) is irradiated for 72 hours (19–22° C.). Distillation under reduced pressure yields unrecated monomer and aectophenone (405 grams) and several cuts of 2,6(or 7)dimethyloldodecahydro-1,4:5,8-dimethanobiphenylene (33 grams, 0.133 mole, boiling point 148° C.). Fifty-two grams of a viscous residue remains. Total conversion is 9.4 percent (0.343 mole). Efficiency, based on total conversion, is 38.8 percent.

The isomeric mixture of 2,6(or 7)dimethyloldodecahydro - 1,4:5,8 - dimethanobiphenylene exhibits spectral characteristics consistent with its structure. Strong O—H stretchings (ca. 3400 cm.$^{-1}$) are evident in the infrared spectrum maxima at 1570 cm.$^{-1}$ and 708 cm.$^{-1}$, indicative of the norbornene double bond, are absent. Similarly, characteristic norbornene olefinic proton resonances (ca. 4$\tau$) are absent in the nuclear magnetic resonance spectrum. Moreover, chemical tests for unsaturation are negative.

*Analysis.*—Calc'd for $C_{16}H_{24}O_2$ (percent): C, 77.86; H, 9.68; molecular weight, 248. Found (percent): C, 77.49; H, 9.43; molecular weight, 242.

It is to be understood that this disclosure of the inventions herein is merely illustrative and is not intended to exclude other embodiments encompassed by these inventions but not specifically recited herein.

EXAMPLE VIII

Pentacyclo[$8.2.1.1^{4,7}.0^{2,9}.0^{3,8}$]tetradecane - 5,11(12)dithiol—to 850 g. (11.2 moles) of freshly distilled, colorless thiolacetic acid was added dropwise under nitrogen 230 g. (1.25 mole) of pentacyclo[$8.2.1.1^{4,7}.0^{2,9}.0^{3,8}$]tetradeca-5,11-diene. The temperature rose to 54° C., and then was held at 40° C. by controlling the rate of addition and by use of an ice bath. When addition of the diene was complete the ice bath was replaced with an oil bath, and the solution was heated and stirred at 45–50° C. for 18 hours. Excess thiolacetic acid was then removed under vacuum. The residue was taken up in 1.5 l. of benzene, and the benzene solution washed successively with two 200 ml. portions of dilute sodium bicarbonate solution to remove any remaining tracees of thiolacetic acid, and finally with one portion of water. The benzene solution was then dried over magnesium sulfate, and solvent was then removed under vacuum to leave a virtually colorless residue of 432 g. (1.29 moles, 103% crude) of bis-thioacetate. In other examples these washings were omitted without harm. When adequately stripped of thiolacetic acid, bis-thioacetate forms a mushy solid material.

The entire residue of bis-acetate was dissolved in 2 l. of benzene and added under nitrogen to a stirred solution of 284 g. (5.25 moles) of sodium methoxide in 3 l. of methanol heated at 50° C. When addition was complete the solution was brought to a gentle reflux (58–59° C.) for 18 hours. It was then poured into 5 l. of water and acidified with dilute hydrochloric acid to pH 3. The organic layer was removed, and the aqueous layer was extracted with three 1 l. portions of benzene. The benzene extracts were combined with the original organic layer, and the solution was washed with two 500 ml. portions of water and dried over magnesium sulfate. Removal of solvent under vacuum left 309.0 g. of a slightly yellow residue. Distillation of this residue in a continuously-fed falling film molecular still at 245° C./0.075 mm. gave 263 g. (80.5% based on diene) of pure pentacyclo[$8.2.1.1^{4,7}.0^{3,8}.0^{2,9}$]tetradecane-5,11)dithiol

*Analysis.*—Calc'd for $C_{14}H_{20}$ (percent): C, 66.62; H, 7.99. Found (percent): C, 67.04; H, 8.05. Calc'd equivalent weight: 126.2. Found (by silver nitrate titration): 127.2, 128.6.

$$\text{"Percentage Purity"} = \frac{\text{Eq. wt. calc'd}}{\text{Eq. wt. found}} = 98.6\%$$

The infrared spectrum of bis-thioacetate showed a sharp carbonyl band at 1072 cm.$^{-1}$. The nuclear magnetic resonance (N.M.R.) spectrum showed acetate methyl at $\tau$7.76 and proton $\alpha$ to sulfur at $\tau$6.85 (multiplet). No signals due to vinyl protons were present even at high gain. Thiol is almost devoid of useful spectral characteristics. The infrared spectrum shows a weak band at 2532 cm.$^{-1}$ (SH), and lacks bands due to vinyl deformation. The nuclear magnetic resonance (N.M.R.) spectrum of dithiol clearly shows protons to sulfur at $\tau$7.4 (multiplet having the general shape of a quartet), but the doublet due to protons on sulfur is covered by the complex signal from ring protons. No vinyl protons could be detected even at high gain.

What is claimed is:

1 Dimercaptans having from 3 to 7 saturated aliphatic hydrocarbon rings therein, wherein its hydrocarbon ring structure is of the group

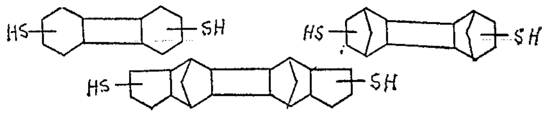

and wherein the two mercapto radicals are each bonded to a different ring as indicated by the free bonds in the above hydrocarbon ring structures.

2. The dimercaptan of claim 1 which contains from 5 to 7 saturated aliphatic hydrocarbon rings therein.

3. The dimercaptan of claim 2 having the formula

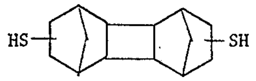

4. The dimercaptan of claim 2 having the formula

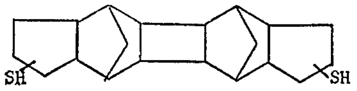

5. A cycloadded dimer of the compounds of the group of a mercaptonorbornene, mercapto-cyclohexene or mercaptobi-cyclo[2.2.2]octene.

References Cited

UNITED STATES PATENTS 3,025,327 3/1962 May et al. ---------- 260—609

CHARLES B, PARKER, Primary Examiner

D. R. PHILLIPS, Assistant Examiner

U.S. Cl. X.R.

204—162; 260—2 R, 2 EC, 67 R, 78 R, 79, 80.75, 80.76, 82.1, 85.3, 85.5 R, 86.1 R, 89.5 R, 89.7 N, 91.1 R, 91.5, 93.3, 332.1, 340.2, 346.2 M, 346.3, 348 R, 398, 399, 404, 404.5, 408, 453 R, 455 C, 464, 465 E, 465 F, 465 G, 465 H, 468 B, 469, 478, 488 B, 500.5 R, 501.15, 502.6, 503, 513.5, 514 B, 543 R, 544 L, 553 R, 557 R, 557 B, 561 R, 563 P, 567.6 M, 569, 570.5 CA, 570.9, 578, 586 A, 598, 607 A, 609 E, 609 F, 610 R, 610 D, 611 A, 611 B, 617 M, 618 R, 618 D, 621 R, 623 R, 644, 647, 648 R, 649 R, 649 DP, 666 PY, 668, 932

PO-1050
(5/69)

UNITED STATES PATENT OFFICE
CERTIFICATE OF CORRECTION

Patent No. 3,644,532 Dated February 22, 1972

Inventor(s) D.R. Arnold et al.

It is certified that error appears in the above-identified patent and that said Letters Patent are hereby corrected as shown below:

Column 46, lines 15 to 19, the formulas should be read without the SH groups and as so read would appear as follows:

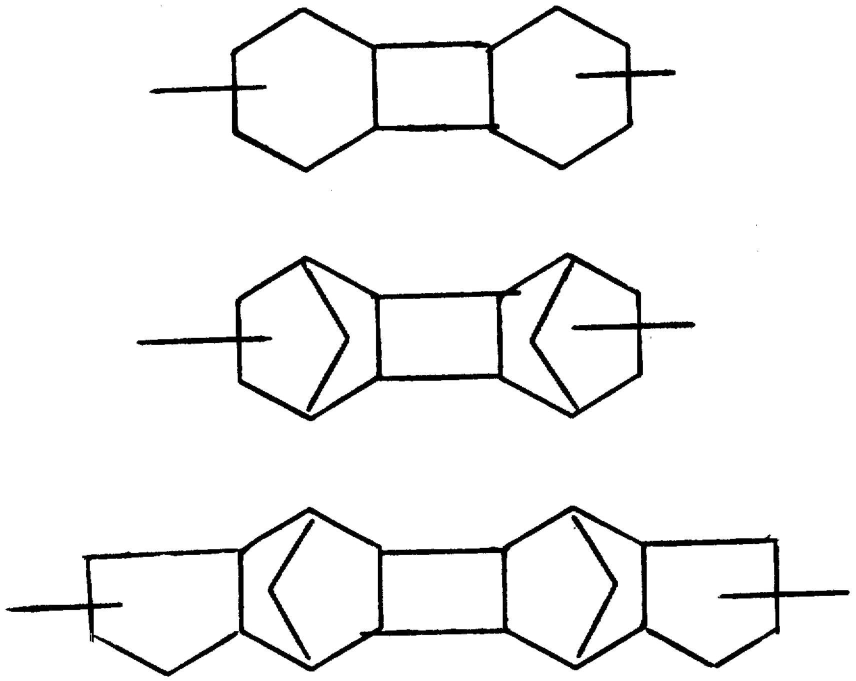

Signed and sealed this 4th day of July 1972.

(SEAL)
Attest:

EDWARD M.FLETCHER, JR.
Attesting Officer

ROBERT GOTTSCHALK
Commissioner of Patents